US009627878B2

(12) United States Patent
Habu et al.

(10) Patent No.: US 9,627,878 B2
(45) Date of Patent: Apr. 18, 2017

(54) DRIVING DEVICE FOR SEMICONDUCTOR ELEMENTS, AND SEMICONDUCTOR DEVICE

(71) Applicants: Yo Habu, Tokyo (JP); Masahiro Yamamoto, Tokyo (JP)

(72) Inventors: Yo Habu, Tokyo (JP); Masahiro Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 59 days.

(21) Appl. No.: 14/655,311

(22) PCT Filed: Jan. 23, 2013

(86) PCT No.: PCT/JP2013/051331
§ 371 (c)(1),
(2) Date: Jun. 24, 2015

(87) PCT Pub. No.: WO2014/115272
PCT Pub. Date: Jul. 31, 2014

(65) Prior Publication Data
US 2016/0028219 A1 Jan. 28, 2016

(51) Int. Cl.
*H02H 3/08* (2006.01)
*H03F 1/52* (2006.01)
(Continued)

(52) U.S. Cl.
CPC ............... *H02H 3/08* (2013.01); *H03F 1/52* (2013.01); *H03F 3/217* (2013.01); *H03K 17/0822* (2013.01)

(58) Field of Classification Search
CPC ................. H01L 2924/0002; H03K 17/0822
(Continued)

(56) References Cited

U.S. PATENT DOCUMENTS 6,104,168 A * 8/2000 Aranovich ............ H02J 7/0052
320/112
2001/0010482 A1 8/2001 Oki et al.
(Continued)

FOREIGN PATENT DOCUMENTS

JP H09-182275 A 7/1997
JP 2002-171140 A 6/2002
(Continued)

OTHER PUBLICATIONS

JP-2008-205662; Entire specification.*
(Continued)

*Primary Examiner* — Dharti Patel
(74) *Attorney, Agent, or Firm* — Studebaker & Brackett PC

(57) ABSTRACT

The device for driving the semiconductor element is provided with a drive circuit section, a charging circuit section and a shutting circuit section. The charging circuit section is electrically connected to an external circuit provided with a diode and a capacitive element. The semiconductor element has a first electrode, a second electrode and a control terminal. The cathode of the diode is connected to the first electrode. One of two terminals of the capacitive element is connected to the cathode of the diode, and the other terminal is connected to the second electrode. The charging circuit section enables the capacitive element to be charged at a higher rate after a timed point at which the voltage on the capacitive element becomes equal to a saturation voltage in a case where the input signal is an on-signal.

16 Claims, 21 Drawing Sheets

(51) Int. Cl.
  *H03F 3/217*    (2006.01)
  *H03K 17/082*   (2006.01)
(58) Field of Classification Search
  USPC ......................................................... 361/101
  See application file for complete search history.

(56) References Cited

U.S. PATENT DOCUMENTS

2003/0030956 A1    2/2003   Noro
2008/0130337 A1*   6/2008   Takahashi ........... H02M 1/4225
                                                         363/126

FOREIGN PATENT DOCUMENTS

JP          2002-208847 A     7/2002
JP          2003-060449 A     2/2003
JP          2008-205662 A     9/2008

OTHER PUBLICATIONS

JP-9-182275; Entire document.*
JP-2003-60449; Entire document.*
JP-2002-171140; Entire document.*
Notification of Transmittal of Translation of the International Preliminary Report on Patentability and Translation of Written Opinion of the International Searching Authority; PCT/JP2013/051331 issued on Aug. 6, 2015.
International Search Report; PCT/JP2013/051331; Apr. 16, 2013.
Written Opinion of the International Searching Authority; PCT/JP2013/051331; Apr. 16, 2013.

* cited by examiner

DRIVING DEVICE FOR SEMICONDUCTOR ELEMENTS, AND SEMICONDUCTOR DEVICE

TECHNICAL FIELD

The present invention relates to a driving device for semiconductor elements and to a semiconductor device.

BACKGROUND ART

Conventionally, a driving device for semiconductor elements capable of coping with the possibility of damage to a semiconductor element caused by an excess current due to a short circuit, as disclosed in Japanese Patent Laid-Open No. 2002-208847 for example, is known. By detecting a collector current in a semiconductor element such as an IGBT, gate shutting for example, which is a protective operation at the time of detection of an excess current, is performed.

Detection of a collector current in a semiconductor element from a collector-emitter voltage VCE detected with a diode is performed. This collector current detection method is thought to be ineffective in accurately detecting the collector current from the VCE detection value in a time period of several microseconds from turn-on to entering a steady state. On the other hand, in a case where a load short circuit or the like occurs due to some cause, a large current (short circuit current) flows immediately after turning on of the semiconductor element. It is preferable to rapidly detect this and perform a protective operation.

A technique to make the collector-emitter voltage VCE converge rapidly on a saturation voltage when the gate is turned on in the above-described conventional art has been disclosed. "Saturation voltage" refers to a drop in voltage between the collector and the emitter electrode when dropping of the voltage between the collector electrode and the emitter electrode stops decreasing while the base current is increased. Rapid sensing of the collector current with VCE after turn-on is enabled thereby. As a result, early execution of a protective operation after turn-on is enabled.

CITATION LIST

Patent Literature

Patent Literature 1: Japanese Patent Laid-Open No. 2002-208847

SUMMARY OF INVENTION

Technical Problem

A case is conceivable where a short circuit occurs due to some cause even during operation in an on-state of a semiconductor element after turning on of the semiconductor element. The collector-emitter voltage of a semiconductor element is ordinarily held in a state of being reduced to a saturation voltage during operation in an on-state. However, the collector-emitter voltage VCE once reduced to the saturation voltage is increased when a large current is caused by a short circuit. As a result, the collector-emitter voltage VCE becomes a voltage which is not a saturation voltage (i.e., "non-saturation voltage"). Therefore, the occurrence of a short circuit can be detected by detecting the occurrence of such a non-saturation voltage during the operation of the semiconductor element in the on state, and a protective operation such as gate shutting can be performed. A sequence of functions to detect such a non-saturation voltage is also called "desat detection function". In some cases, a desat detection circuit for realizing the desat function is incorporated in a driving device for semiconductor elements (a gate driver IC as an actual component part).

The collector-emitter voltage is not immediately reduced to the saturation voltage after turn-on. That is, it takes certain time for the collector-emitter voltage to reach the saturation voltage. Therefore, a time period in which a non-saturation voltage appears exists even immediately after turn-on. This is, so to say, a normal non-saturation voltage state when the semiconductor element is normally driven. The above-mentioned Patent Literature also includes a description relating to this point. Erroneously detecting by the desat detection function such a non-saturation voltage immediately after turn-on as a result of the occurrence of a short circuit should be avoided. The conventional desat detection circuit, therefore, has a "blanking time" set in the desat detection function. A mechanism is provided such that the detection of a non-saturation voltage is not immediately recognized as the occurrence of a short circuit; if a time period during which a non-saturation voltage is detected in the on-state after turn-on exceeds the blanking time, it is determined that the occurrence of a short circuit is sensed.

This blanking time setting enables avoidance of erroneous detection of the normal non-saturation voltage state immediately after turn-on. However, this blanking time also has an influence even when a short circuit occurs during the operation in the on-state of the semiconductor element after the saturation voltage is once reached after turn-on. Although it is desirable to immediately detect a non-saturation voltage due to a short circuit and execute the protective operation, the detection of the non-saturation voltage (i.e., the detection of the short circuit) is inevitably retarded because of the blanking time, resulting in failure to perform at an early stage the protective operation which is to be performed at the occurrence of the short circuit.

The present invention has been achieved to address the above-described problem, and an object of the present invention is to provide a driving device for semiconductor elements and a semiconductor device capable of immediately protecting a semiconductor element at the occurrence of a short circuit.

Solution to Problem

A device for driving a semiconductor element includes:

a drive circuit section electrically connected to a semiconductor element including a first electrode, a second electrode and a control terminal with which switching between conduction and shut between the first and second electrodes is performed, the drive circuit section driving the semiconductor element by receiving an input signal, producing a drive signal from the input signal and supplying the drive signal to the control terminal;

a charging circuit section electrically connected to an external circuit including a diode having its cathode connected to the first electrode and a capacitive element having one of its two terminals connected to the anode of the diode and having the other of its terminals connected to the second electrode, the charging circuit section charging the capacitive element on the basis of one of the input signal and the drive signal, the charging circuit section detecting a charging voltage at which the capacitive element is charged, supplying a constant current of a first value to a point of connection between the anode and the one of the two terminals when the charging voltage is lower than a saturation voltage of the semiconductor element in a case where the one of the signals is an on-signal, and supplying to the connection point a constant current of a second value larger than the first value after a timed point at which the charging voltage becomes equal to the saturation voltage of the semiconductor element; and a shutting circuit section which shuts off the supply of the drive signal to the control terminal from the drive circuit section when the charging voltage reaches a threshold value.

A semiconductor device includes:

a semiconductor element including a first electrode, a second electrode and a control terminal with which switching between conduction and shut between the first and second electrodes is performed;

a drive circuit section electrically connected to the semiconductor element, the drive circuit section driving the semiconductor element by receiving an input signal, producing a drive signal from the input signal and supplying the drive signal to the control terminal;

a charging circuit section electrically connected to an external circuit including a diode having its cathode connected to the first electrode and a capacitive element having one of its two terminals connected to the anode of the diode and having the other of its terminals connected to the second electrode, the charging circuit section charging the capacitive element on the basis of one of the input signal and the drive signal, the charging circuit section detecting a charging voltage at which the capacitive element is charged, supplying a constant current of a first value to a point of connection between the anode and the one of the two terminals when the charging voltage is lower than a saturation voltage of the semiconductor element in a case where the one of the signals is an on-signal, and supplying to the connection point a constant current of a second value larger than the first value after a timed point at which the charging voltage becomes equal to the saturation voltage of the semiconductor element; and a shutting circuit section which shuts off the supply of the drive signal to the control terminal from the drive circuit section when the charging voltage reaches a threshold value.

Advantageous Effect of Invention

According to the present invention, the capacitive element is rapidly charged after a timed point at which the voltage across the capacitive element becomes equal to the saturation voltage of the semiconductor element, thereby enabling the semiconductor element to be immediately protected at the occurrence of a short circuit.

DESCRIPTION OF EMBODIMENTS

Embodiment 1
[Configuration of Device and Circuit in Embodiment 1]

Figure 1:
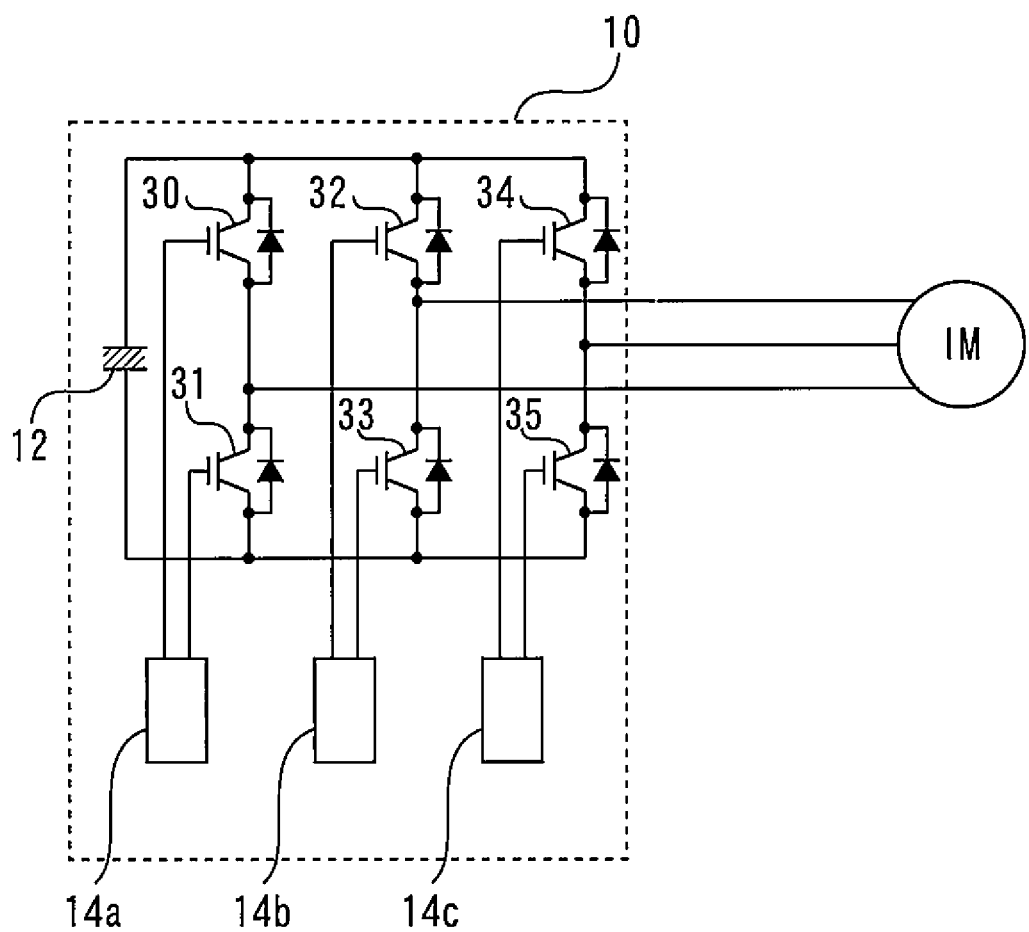
FIG. 1 is a diagram showing the configuration of a semiconductor device according to Embodiment 1 of the present invention.

FIG. 1 is a diagram showing the configuration of a semiconductor device according to Embodiment 1 of the present invention. The semiconductor device according to Embodiment 1 is an inverter device 10. The inverter device 10 is a three-phase alternating-current inverter having three arm circuits. Each arm circuit has two insulated gate bipolar transistors (IGBTs).

The inverter device 10 has a total of six IGBTs (IGBTs 30, 31, 32, 33, 34, and 35). The six IGBTs have configurations identical to each other and each have one freewheel diode. However, the present invention is not limited to this. The inverter device 10 may be an inverter having one or two arm circuits. Collectors of the IGBTs 30, 32, and 34 at a high side are connected to a common bus; emitters of the IGBTs 31, 33, and 35 at a low side are connected to a common bus, and a smoothing capacitor 12 is inserted between the two buses.

The inverter device 10 is provided with three drive circuits (drive circuits 14a, 14b, and 14c). Each of the drive circuits 14a, 14b, and 14c includes a gate driver HVIC incorporating a gate drive circuit. The drive circuits 14a, 14b, are 14c are connected to the arm circuits in a one-to-one relationship.

(Drive Circuit 14a)

Figure 2:
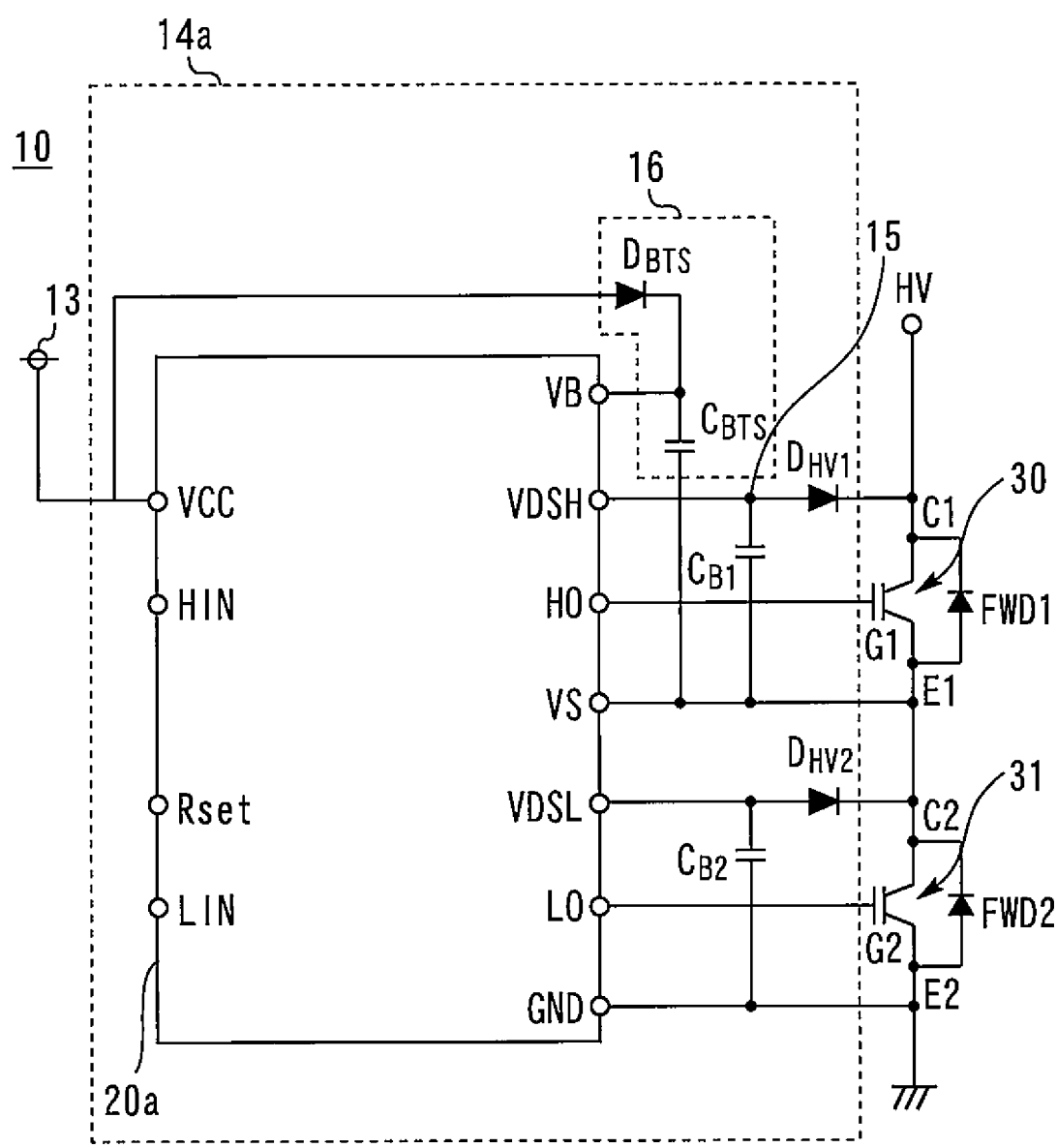
FIG. 2 is a circuit diagram showing a configuration of a driving device for semiconductor elements according to Embodiment 1 of the present invention.

FIG. 2 is a circuit diagram showing a configuration of a driving device for semiconductor elements according to Embodiment 1 of the present invention and an external circuit connected to the driving device for semiconductor elements. FIG. 2 illustrates the drive circuit 14a. The drive circuit 14a includes an HVIC 20a which is a driving device for semiconductor elements according to Embodiment 1 and a blanking capacitive element CB1 and a high-withstand-voltage diode DHV1 electrically connected to the HVIC 20a. The blanking capacitive element CB1 and the high-withstand-voltage diode DHV1 are referred to as "external circuit" for convenience sake. FIG. 2 illustrates the drive circuit 14a and the IGBTs 30 and 31 driven by the drive circuit 14a. The drive circuits 14b and 14c each have the same configuration as that of the drive circuit 14a except for the IGBT to be driven. Therefore the illustration of the drive circuits 14b and 14c is omitted.

The drive circuit 14a incorporates a desat detection function. The desat detection function, which is one of IGBT excess current detection functions, is a function to detect a non-saturation (short circuit) by monitoring the voltage between the collector and the emitter of the IGBT when the IGBT is on. In the inverter device 10 according to the present embodiment, this desat detection function is realized by the HVIC 20a, the blanking capacitive element CB1 and the high-withstand-voltage diode DHV1.

As shown in FIG. 2, the inverter device 10 is provided with the HVIC 20a and the IGBTs 30 and 31 driven by the HVIC 20a. Freewheel diodes FWD1 and FWD2 are connected to the IGBTs 30 and 31, respectively. A bootstrap circuit 16, blanking capacitive elements CB1 and CB2 and high-withstand-voltage diodes DHV1 and DHV2 are provided on the periphery of the HVIC 20a.

The HVIC 20a is provided with a power supply terminal VCC, a terminal HIN, a terminal LIN, a terminal VB, a terminal VS, a terminal HO, a terminal LO, a ground terminal GND, and desat terminals VDSH and VDSL. The power supply terminal VCC is connected to a power supply 13.

The terminal HIN is an input signal terminal to which a signal to be input to the high-side switching semiconductor element (IGBT 30) is supplied. The terminal LIN is an input signal terminal to which a signal to be input to the low-side switching semiconductor element (IGBT 31) is supplied. These terminals HIN and LIN are connected to an external control circuit (a microcontroller or the like for control). In carrying out pulse width modulation (PWM) control, pulse signals are supplied to the terminals HIN and LIN and the pulse widths of these signals are changed (the duty ratios are changed).

The terminal HO is an output signal terminal from which a drive signal for the high-side switching semiconductor element (IGBT 30) is output. The terminal LO is an output signal terminal from which a drive signal for the low-side switching semiconductor element (IGBT 31) is output.

The desat terminal VDSH is a terminal for detecting a non-saturation voltage with respect to the collector-emitter voltage VCE in the high-side IGBT. The desat terminal VDSL is a terminal for detecting a non-saturation voltage with respect to the collector-emitter voltage VCE in the low-side IGBT.

The circuit configuration at the high side will first be described. The terminal HO is connected to the gate of the IGBT 30. The terminal VS is connected to the emitter E1 of the IGBT 30. The collector C1 of the IGBT 30 is connected to a high voltage HV, and a cathode of the high-withstand-voltage diode DHV1 is connected to an intermediate point therebetween. An anode of the high-withstand-voltage diode DHV1 is connected to the desat terminal VDSH. One of the two terminals of the blanking capacitive element CB1 is connected to an intermediate point between the desat terminal VDSH and the anode of the high-withstand-voltage diode DHV1. The other terminal of the blanking capacitive element CB1 is connected to an intermediate point between the emitter E1 of the IGBT 30 and the terminal VS. As shown in FIG. 2, one of two terminals of a bootstrap capacitor CBTS is connected to an intermediate point between the emitter E1 of the IGBT 30 and the terminal VS and adjacent to the other terminal of the blanking capacitive element CB1. In this circuit configuration, the terminal-to-terminal voltage across the blanking capacitive element CB1 equals the collector-emitter voltage of the IGBT 30. Therefore, a non-saturation voltage with respect to the collector-emitter voltage VCE of the IGBT 30 can be detected by monitoring the potential on the desat terminal VDSH.

The circuit configuration at the low side will subsequently be described. The terminal LO is connected to the gate of the IGBT 31. The ground terminal GND is connected to the emitter E2 of the IGBT 31. The collector C2 of the IGBT 31 is connected to the emitter E1 of the IGBT 30, and a cathode of the high-withstand-voltage diode DHV2 is connected to an intermediate point therebetween. An anode of the high-withstand-voltage diode DHV2 is connected to the desat terminal VDSL. One of the two terminals of the blanking capacitive element CB2 is connected to an intermediate point between the desat terminal VDSL and the anode of the high-withstand-voltage diode DHV2. The other terminal of the blanking capacitive element CB2 is connected to an intermediate point between the emitter E2 of the IGBT 31 and the ground terminal GND. In this circuit configuration, the terminal-to-terminal voltage across the blanking capacitive element CB2 equals the collector emitter voltage of the IGBT 31. Therefore, a non-saturation voltage with respect to the collector-emitter voltage VCE of the IGBT 31 can be detected by monitoring the potential on the desat terminal VDSL.

(Bootstrap Circuit)

The bootstrap circuit 16 includes a bootstrap diode DBTS and the bootstrap capacitor CBTS. An anode of the bootstrap diode DBTS is connected to an intermediate point between the power supply and the terminal VCC. A cathode of the bootstrap diode DBTS is connected to the other terminal of the bootstrap capacitor CBTS. An intermediate point between the bootstrap diode DBTS and to the other terminal of the bootstrap capacitor CBTS is connected to the terminal VB.

In general, driving a high-side switching semiconductor element requires increasing a power supply for a high-side drive circuit for driving this switching element by a certain potential from a potential on the high-side switching semiconductor element (source potential in the case of a MOSFET, or emitter potential in the case of an IGBT). A bootstrap circuit method is known as one of methods for applying this voltage.

Also in the present embodiment, driving the high-side IGBT 30 requires increasing the power supply for the high-side drive circuit by a predetermined potential from the potential on the emitter of the IGBT 30. In the circuit shown in FIG. 2, the bootstrap capacitor CBTS is charged through the bootstrap diode DBTS. The high potential for driving the IGBT 30 can be produced by this charging voltage.

Figure 3:
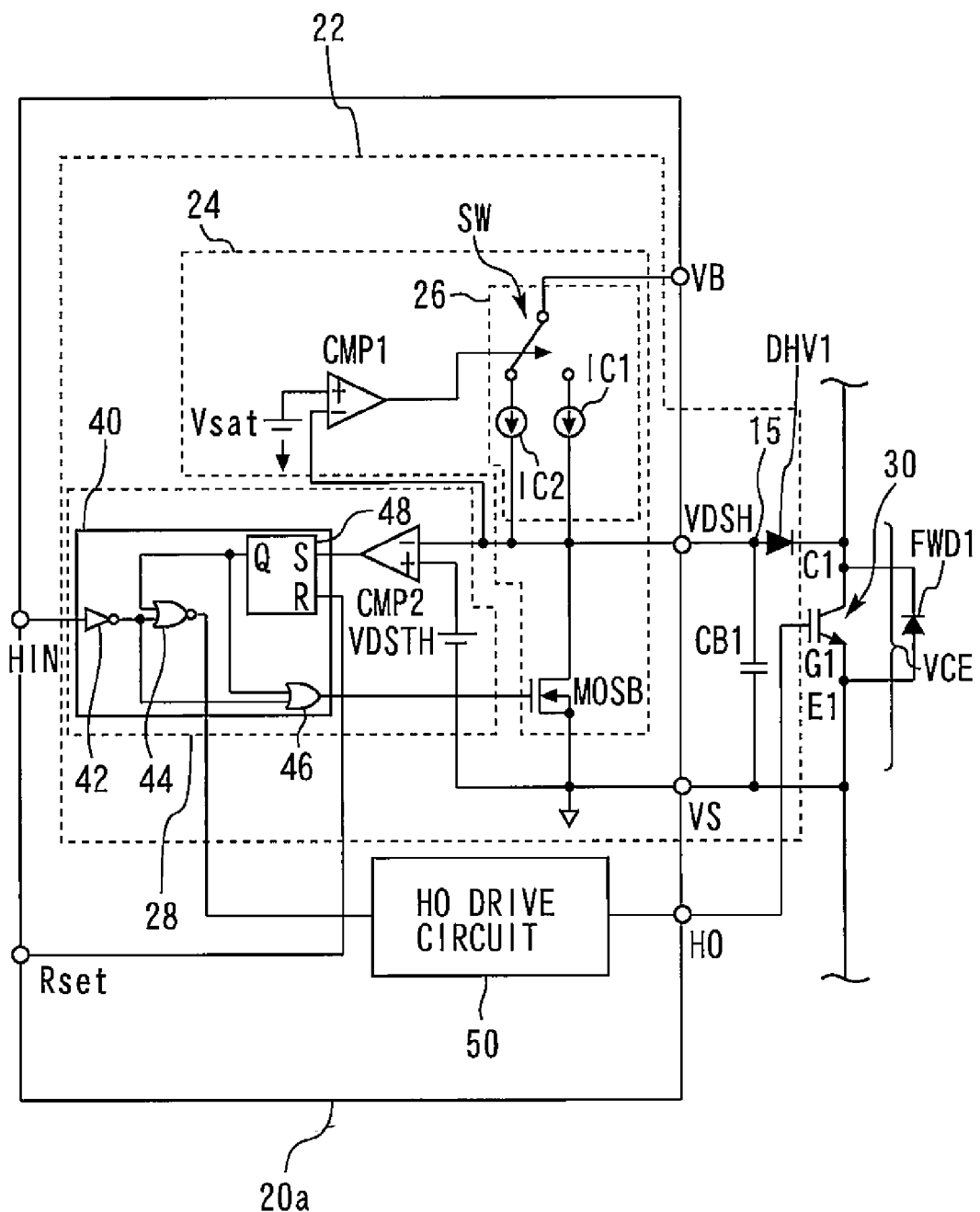
FIG. 3 is a circuit diagram showing a portion of the configuration of the driving device for semiconductor elements according to Embodiment 1 of the present invention, i.e., an enlarged diagram of portions of the internal circuit of the HVIC 20*a* and the circuit on the periphery thereof.

FIG. 3 is a circuit diagram showing a portion of the configuration of the driving device for semiconductor elements according to Embodiment 1 of the present invention, i.e., an enlarged diagram of portions of the internal circuit of the HVIC 20a and the circuit on the periphery of the HVIC 20a. In FIG. 3, the configuration at the high side (the configuration around the high-side IGBT 30) is enlarged. Referring to FIG. 3, the desat terminal VDSH is connected to the collector C1 of the IGBT 30 through the high-withstand-voltage diode DHV1, and the blanking capacitive element CB1 is inserted between the desat terminal VDSH and the terminal VS, as described above with reference to FIG. 2.

(Drive Circuit Section)

FIG. 3 shows an HO drive circuit section 50 incorporated in the HVIC 20a. The HO drive circuit section 50 is connected to the gate G1 of the IGBT 30. The HO drive circuit section 50 receives an input signal IN from the terminal IN through a desat protection circuit section 40. The HO drive circuit section 50 produces a drive signal HO from the input signal IN and supplies the drive signal HO to the gate G1, thereby driving (turning on/off) the IGBT 30.

(Desat Detection Circuit Section)

FIG. 3 shows a desat detection circuit section 22. The desat detection circuit section 22 is a circuit for achieving the "desat detection function" by cooperating with the blanking capacitive element CB1 and the high-withstand-voltage diode DHV1. That is, a case is conceivable where a short circuit occurs due to some cause during the operation in the on-state after the IGBT 30 is turned on. During the operation in the on-state in ordinary cases, the collector emitter voltage VCE of the IGBT 30 is reduced to the saturation voltage. However, when a large current is caused by a short circuit in such a case, the collector emitter voltage VCE of the IGBT 30 once reduced is increased to be a voltage different from the saturation voltage (i.e., a "non-saturation voltage"). The occurrence of a short circuit can be detected by detecting the occurrence of such a non-saturation voltage during the operation of the IGBT 30 in the on-state, thus enabling a protective operation such as gate shutting. A sequence of functions to detect such a non-saturation voltage is also called "desat detection function".

The desat detection circuit section 22 has components shown below.

Internal circuit of HVIC 20a (charging circuit section 24 and shutting circuit section 28)

External circuitry (high-withstand-voltage diode DHV1, and blanking capacitive element CB1)

(High-Withstand-Voltage Diode DHV1)

The high-withstand-voltage diode DHV1 has an anode and a cathode. The cathode is connected to the collector C1 of the IGBT 30. The high-withstand-voltage diode DHV1 functions to clamp the terminal-to-terminal voltage across the blanking capacitive element CB1 at the level of the saturation voltage when the collector-emitter voltage VCE of the IGBT 30 is the saturation voltage.

That is, supply of current from an ordinarily operational constant current source IC1 to the blanking capacitive element CB1 causes an increase in the terminal-to-terminal voltage across the blanking capacitive element CB1. On the other hand, the collector-emitter voltage VCE of the IGBT 30 drops to the saturation voltage after turn-on. Then the charging voltage across the blanking capacitive element CB1 connected in parallel between the collector and emitter of the IGBT 30 is clamped at the same level as that of the saturation voltage of the IGBT 30. At this time, the constant current from the ordinarily operational constant current source IC1 flows to the IGBT 30 through the high-withstand-voltage diode DHV1.

On the other hand, when the collector-emitter voltage VCE of the IGBT 30 becomes a non-saturation voltage, the charging voltage across the blanking capacitive element CB1 is not clamped at the saturation voltage. That is, when the collector-emitter voltage VCE becomes a non-saturation voltage, the potential on the cathode side of the high-withstand-voltage diode DHV1 is correspondingly increased and the constant current from the ordinarily operational constant current source IC1 flows to the blanking capacitive element CB1 side. As the constant current is supplied, the blanking capacitive element CB1 is further charged. When the blanking capacitive element CB1 thereafter exceeds a constant value, the occurrence of a short circuit is detected. This constant value is the value of a desat threshold voltage VDSTH described later. In some cases, the value of the desat threshold voltage VDSTH is represented by the symbol VDSTH for ease of description.

(Blanking Capacitive Element CB1)

One of two terminals of the blanking capacitive element CB1 is connected to the cathode of the high-withstand-voltage diode DHV1, and the other terminal is connected to the emitter E1 of the IGBT 30.

The blanking capacitive element CB1 functions to generate a "blanking time". The reason for setting a blanking time is that erroneous detection of a non-saturation voltage in a time period during which the IGBT 30 is off while the input signal IN is high should be avoided. That is, the collector-emitter voltage is not reduced to the saturation voltage immediately after turn-on; it takes certain time for the collector-emitter voltage to reach the saturation voltage. Therefore, a time period in which a non-saturation voltage appears exists even immediately after turn-on. More specifically, a non-saturation voltage appears in a time period (b) shown in FIG. 6 later referred to. This is, so to say, a normal non-saturation voltage state when the IGBT 30 is normally driven. Erroneously detecting by the desat detection function such a non-saturation voltage immediately after turn-on as a result of the occurrence of a short circuit should be avoided. A "blanking time" is therefore set in the desat detection function. A mechanism is provided such that the detection of a non-saturation voltage is not immediately recognized as the occurrence of a short circuit; if a time period during which a non-saturation voltage is detected in the on-state after turn-on exceeds the blanking time, it is determined that the occurrence of a short circuit is sensed. This blanking time setting enables avoidance of erroneous detection of the normal non-saturation voltage state immediately after turn-on.

The blanking time is determined by the capacitance value of the blanking capacitive element CB1, the magnitude of the constant current supplied to the blanking capacitive element CB1 (i.e., the charging rate) and the desat threshold voltage described later. The blanking time is the time period from the beginning of charging of the blanking capacitive element CB1 by the constant current to the point in time at which the desat threshold voltage is reached (so to say, margin time).

(Charging Circuit Section 24)

The charging circuit section 24 in Embodiment 1 has components shown below.

Transistor MOSB

Comparator CMP1

Constant current supply section 26

The transistor MOSB is a MOS transistor. A signal synchronized with the input signal to the terminal HIN is supplied to the gate. The source and drain of the transistor MOSB are connected in parallel with the blanking capacitive element CB1. In the present embodiment, the terminal HIN and the gate of the transistor MOSB are electrically connected to each other through a NOT circuit 42 and an OR circuit 46 provided in the desat protection circuit section 40. The desat protection circuit section 40 will be described later in detail. When the input signal to the terminal HIN is an on-signal (high voltage), the voltage on the gate of the transistor MOSB is low because of the intermediation by the NOT circuit 42, and the transistor MOSB is off. Also, when the input signal to the terminal HIN is an off-signal (low voltage), the voltage on the gate of the transistor MOSB is high because of the intermediation by the NOT circuit 42, and the transistor MOSB is on. The transistor MOSB can be turned on and off according to the signal synchronized with the input signal to the terminal HIN.

When the input signal to the terminal HIN is a high voltage, the transistor MOSB is off and the conduction between the two terminals of the blanking capacitive element CB1 is shut off. That is, when the input signal to the terminal HIN is a high voltage, the blanking capacitive element CB1 can be charged by supplying a current to the blanking capacitive element CB1. When the input signal to the gate becomes a low voltage, the transistor MOSB is turned on and the two terminals of the blanking capacitive element CB1 are short-circuited (conduction is made). That is, when the input signal to the input terminal HIN becomes a low voltage in a situation where the blanking capacitive element CB1 is charged, the transistor MOSB is turned on and the blanking capacitive element CB1 is discharged thereby. The transistor MOSB operating in this way functions as a capacitor charging transistor.

The comparator CMP1 has two terminals (a positive terminal, a negative terminal) to which voltages to be compared with each other are input. A voltage source of a reference voltage is connected to the positive terminal of the comparator CMP1. This reference voltage source supplies a voltage Vsat equal to the saturation voltage of the IGBT 30. The desat terminal VDSH is connected to the negative terminal of the comparator CMP1. The comparator CMP1 outputs a high voltage as an output signal when the voltage on the desat terminal VDSH (i.e., the voltage at which the blanking capacitive element CB1 is charged) reaches the voltage Vsat.

The constant current supply section 26 includes two constant current sources and a switch section SW. The two constant current sources are the ordinarily operational constant current source IC1 and a rapid charging constant current source IC2. These two constant current sources are alternatively connected to the terminal VB through the switch section SW. The ordinarily operational constant current source IC1 produces a constant current of a first value from the voltage on the terminal VB. The rapid charging constant current source IC2 produces a constant current of a second value from the voltage on the terminal VB. The second-value constant current is larger than the first-value constant current. As the circuit configuration of each constant current source, any of various well-known constant-current circuits may be used.

The switch section SW is connected to the comparator CMP1 and alternatively connects one of the ordinarily operational constant current source IC1 and the rapid charging constant current source IC2 to the blanking capacitive element CB1 on the basis of the output from the comparator CMP1. More specifically, the switch section SW changes the connecting state according to the output from the comparator CMP1, as described in (1) and (2) below.

(1) Voltage on Terminal VDSH (Voltage at Which Blanking Capacitive Element CB1 is Charged)<Vsat In this case, the output from the comparator CMP1 is a low voltage. When the output from the comparator CMP1 is the low voltage, the switch section SW connects the terminal VB to the ordinarily operational constant current source IC1. As a result, the ordinarily operational constant current source IC1 produces the first-value constant current and this constant current is supplied to a connection point 15 descried below through the desat terminal VDSH.

(2) Voltage on Terminal VDSH (Voltage at Which Blanking Capacitive Element CB1 is Charged)≥Vsat When the voltage on the terminal VDSH (the voltage at which the blanking capacitive element CB1 is charged) reaches Vsat, the output from the comparator CMP1 becomes the high voltage. When the output from the comparator CMP1 is the high voltage, the switch section SW connects the terminal VB to the rapid charging constant current source IC2. As a result, the rapid charging constant current source IC2 produces the second-value constant current and this constant current is supplied to the connection point 15 descried below through the desat terminal VDSH.
(Connection Point 15)

The "connection point 15" will be described. The connection point 15 is an intermediate connection point at which the anode of the high-withstand-voltage diode DHV1 and one of the two terminals of the blanking capacitive element CB1 are connected to each other. The connection point 15 is electrically connected to the terminal VDSH and is also connected to the constant current supply section 26.

The constant current supply section 26 is capable of changing the current to be supplied to the connection point 15 between the first-value constant current and the second-value constant current with the above-described switch section SW. This changing is as described below. When the comparator CMP1 does not issue the output signal high voltage, the first-value constant current is used as the current to be supplied to the connection point 15. On the other hand, when the comparator CMP1 issues the output signal high voltage, the second-value constant current is used as the current to be supplied to the connection point 15.

When the voltage at which the blanking capacitive element CB1 is charged is smaller than Vsat (=saturation voltage) in the case where the input signal is the on-signal (high voltage), the first-value constant current is supplied to the connection point 15. At or after a time at which the voltage at which the blanking capacitive element CB1 is charged becomes equal to Vsat (=saturation voltage) in the case where the input signal is the on-signal (high voltage), the second-value constant current is supplied to the connection point 15.

As described above, the second-value constant current is larger than the first-value constant current. The first-value constant current is the constant current from the ordinarily operational constant current source IC1, while the second-value constant current is the constant current from the rapid charging constant current source IC2.

The direction in which the constant current supplied to the connection point 15 flows thereafter is determined as described below.

That is, when the collector-emitter voltage VCE drops to the saturation voltage, the voltage at which the blanking capacitive element CB1 is charged is clamped at the same level as that of the saturation voltage of the IGBT 30, as described above. At this time, the constant current from the constant current supply section 26 flows into the IGBT 30 through the high-withstand-voltage diode DHV1.

On the other hand, when the collector-emitter voltage VCE becomes a non-saturation voltage, the cathode potential on the high-withstand-voltage diode DHV1 is correspondingly increased. The constant current from the constant current supply section 26 flows to the blanking capacitive element CB1 side according to the increase in cathode potential. As a result, the blanking capacitive element CB1 is further charged.

(Shutting Circuit Section 28)

The shutting circuit section 28 includes a comparator CMP2 and the desat protection circuit section 40.

A positive terminal of the comparator CMP2 is connected to the desat terminal VDSH. The comparator CMP2 receives through its positive terminal the voltage at which the blanking capacitive element CB1 is charged. A negative terminal of the comparator CMP2 is connected to a desat threshold voltage source VDSTH. The desat threshold voltage source VDSTH produces a threshold voltage serving as a desat threshold. The voltage of the desat threshold voltage source VDSTH is higher than the saturation voltage and higher than Vsat, i.e., the reference voltage to the comparator CMP1. The comparator CMP2 issues a high voltage as an output signal when the voltage on the desat terminal VDSH reaches the desat threshold voltage (VDSTH). The high voltage issued from the comparator CMP2 serves as a "short circuit detection signal".

The desat protection circuit section 40 is connected to the comparator CMP2. When the output signal from the comparator CMP2 becomes the high voltage (that is, when the short circuit detection signal is issued), the desat protection circuit section 40 shuts off the supply of the drive signal produced by the HO drive circuit section 50. The desat protection circuit section 40 includes the NOT circuit 42, a NOR circuit 44, the OR circuit 46 and a latch circuit 48.

The connections of these logic circuits will be described. First, the terminal HIN is connected to an input of the NOT circuit 42. The NOR circuit 44 receives an output from the NOT circuit 42 and an output Q from the latch circuit 48 and outputs the result of a NOR logic operation on these values. The OR circuit 46 receives the output from the NOR circuit 44 and the output Q from the latch circuit 48 and outputs the result of an OR logic operation on these value.

The output from the NOR circuit 44 is input to the HO drive circuit section 50. The input signal to the gate G1 of the IGBT 30 is produced from the waveform of the output signal from the NOR circuit 44 through the HO drive circuit section 50. The NOR circuit 44 issues an output formed by inverting the output signal from the NOT circuit 42 when the output Q from the latch circuit 48 is a low voltage (the logical value is zero). In this case, the ordinary operation is executed in which the input to the HO drive circuit section 50 is changed according to the waveform of the input to the terminal HIN. On the other hand, when the output Q from the latch circuit 48 is a high voltage (the logical value is 1), the NOR circuit 44 holds its output at a low voltage (the logical value is zero) irrespective of the value of the input to the NOT circuit 42. In this case, the input to the HO drive circuit section 50 is held at the low voltage irrespective of the waveform of the input to the terminal HIN. Thus, "gate signal shutting protection operation on IGBT 30" is realized.

The output from the OR circuit 46 is input to the gate of the transistor MOSB. When the output Q from the latch circuit 48 is the low voltage (the logical value is zero), the OR circuit 46 issues the same output as the output signal from the NOT circuit 42. In this case, the operation to turn on/off the gate of the transistor MOSB according to the waveform of the input to the terminal HIN (the operation to charge/discharge the blanking capacitive element CB1) is executed. That is, when the voltage on the terminal HIN is high, the voltage on the gate of the transistor MOSB is low and the transistor MOSB is off. When the voltage on the terminal HIN is low, the voltage on the gate of the transistor MOSB is high and the transistor MOSB is on. On the other hand, when the output Q from the latch circuit 48 is the high voltage (the logical value is 1), the OR circuit 46 holds its output at a high voltage (the logical value is 1) irrespective of the value of the input to the NOT circuit 42. In this case, the gate of the transistor MOSB is held at the high voltage irrespective of the waveform of the input to the terminal HIN, thereby maintaining the blanking capacitive element CB1 in a discharged state.

The latch circuit 48 receives through its S terminal the output signal from the comparator CMP2 and changes the output Q. It is assumed that the voltage on an R terminal of the latch circuit 48 is normally low (the logical value is zero). The output Q from the latch circuit 48 is input to the NOR circuit 44 and the OR circuit 46, as described above. During the time period during which the output from the comparator CMP2 is low voltage, the latch circuit 48 holds the output Q at the low voltage. On the other hand, when the output from the comparator CMP2 is the high voltage (that is, when the short circuit detection signal is issued), the latch circuit 48 holds the output Q at the high voltage. As a result of the operation thus performed, when the voltage on the desat terminal VDSH reaches the desat threshold (VDSTH), and when the comparator CMP2 issues the output signal high voltage, the voltage of the output Q becomes high and the output from the NOR circuit 44 is held at the low voltage, thus executing the "gate signal shutting protection operation on IGBT 30".

The R terminal of the latch circuit 48 is connected to a terminal Rset provided on the HVIC 20a. After the "gate signal shutting protection operation on IGBT 30" is executed, the IGBT 30 is maintained in the off-state irrespective of the input signal to the terminal HIN. For release from this state, the output Q from the latch circuit 48 may be returned to the low voltage (logical value is zero) by inputting the high voltage (the logical value is 1) to the terminal Rset.

The following is a summary of the above.

(a) When the Output Q from the Latch Circuit 48 is Low Voltage

The input signal to the terminal HIN is input to the NOT circuit 42. The NOR circuit 44 issues an output formed by inverting the output signal from the NOT circuit 42 when the output Q from the latch circuit 48 is a low voltage (the logical value is zero). As a result, a pulse signal of the same width as that of the input signal (input pulse) to the terminal HIN is input to the HO drive circuit section 50, and the gate drive signal is produced according to the input signal. This is the normal operation.

(b) When the Output Q from the Latch Circuit 48 is High Voltage

When the output Q from the latch circuit 48 is a high voltage (the logical value is 1), the NOR circuit 44 holds its output at a low voltage (the logical value is zero) irrespective of the value of the input to the NOT circuit 42. In this case, the input to the HO drive circuit section 50 held at the low voltage irrespective of the waveform of the input to the terminal HIN, thus realizing "gate signal shutting protection operation on IGBT 30"

At the low side, the basically the same circuit configuration (high-withstand-voltage diode DHV2, blanking capacitive element CB2, charging circuit section 24, shutting circuit section 28) as the circuit configuration at the high side shown in FIG. 3 is provided. Differences between the low side and the high side reside in terminals for connection, while the circuit configurations of the desat detection circuits at the low and high sides are identical to each other. That is, the desat detection circuit can also be provided at the low side by replacing "IGBT 30 and freewheel diode FWD1" with "IGBT 31 and freewheel diode FWD2", replacing the terminal HIN with the terminal LIN, replacing the terminal VB with the terminal VCC, replacing the desat terminal VDSH with the desat terminal VDSL, replacing the terminal HO with the terminal LO and replacing the terminal VS with the ground terminal GND in the same circuit configuration as the desat detection circuit section 22 shown in FIG. 3. To understand the circuit operation of the desat detection circuit at the low side, the description made above of the circuit operation of the desat detection circuit section 22 may be reread with reference to the above-described terminal replacements. Thus, the desat detection functions and the protection operation can be separately performed on each of the IGBT 30, which is the high-side switching element, and the IGBT 31, which is the low-side switching element.

(IGBT)

Figure 4:
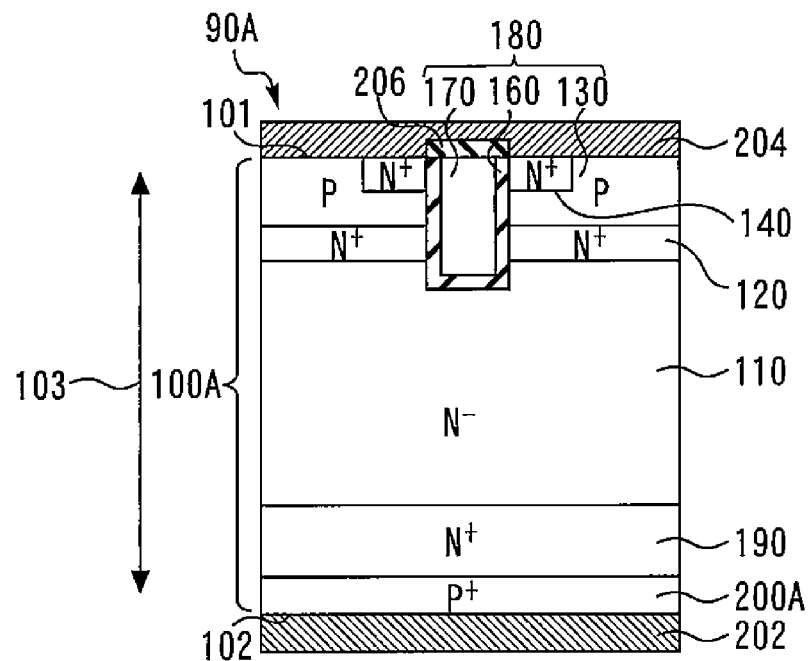
FIG. 4 exemplifies a longitudinal sectional view of a semiconductor chip for the IGBT 30 driven by the driving device for semiconductor elements according to Embodiment 1 of the present invention, illustrating the structure of one IGBT unit element 90A.

FIG. 4 exemplifies a longitudinal sectional view of a semiconductor chip for the IGBT 30 driven by the driving device for semiconductor elements according to Embodiment 1 of the present invention, illustrating the structure of one IGBT unit element 90A. That is, in the present embodiment, the IGBT 30 is one semiconductor chip (not illustrated) and a plurality of IGBT unit elements 90A illustrated in FIG. 4 are provided in one semiconductor chip.

In the example shown in FIG. 4, the semiconductor chip includes a semiconductor substrate (hereinafter referred to simply as "substrate") 100A, and a drift layer 110, a carrier accumulation layer 120, a base layer 130, an emitter layer 140, a groove (i.e., a trench) 150, a gate insulating film 160, a gate electrode 170, a buffer layer 190 and a collector layer 200A are formed in the semiconductor substrate 100A.

The semiconductor substrate 100A is a substrate obtained by performing various treatments on a semiconductor substrate as a starting material (e.g., a silicon substrate, a silicon carbide substrate, or the like).

A case where the conduction type of the drift layer 110 is an N-type, more specifically a case where the drift layer 110 is an N-type layer ($N^-$-type layer) having an impurity concentration set in a range ordinarily called a low-concentration range is illustrated. A case where the conduction type of the carrier accumulation layer 120 is an N-type, more specifically a case where the carrier accumulation layer 120 is an N-type layer ($N^+$-type layer) having an impurity concentration higher than that in the drift layer 110 and set in a range ordinarily called a high-concentration range is illustrated.

The emitter layer 140 described below is formed in a portion of the base layer 130. A case where the conduction type of the base layer 130 is a P-type is illustrated here. The base layer 130 may also be called "channel forming semiconductor layer 130" because the base layer 130 is a semiconductor layer having a channel formed in a metal insulator semiconductor (MIS) structure as described below.

The emitter layer 140 is set as a well occupying a portion of the region of the base layer 130. The emitter layer 140 is separately provided for each IGBT unit element 90A. A case where the conduction type of the emitter layer 140 is an N-type, more specifically a case where the emitter layer 140 is an $N^+$-type layer having an impurity concentration higher than that in the drift layer 110 is illustrated here.

The groove 150 is formed from one major surface 101 of the substrate 100A toward another major surface 102 of the substrate 100A, reaching a predetermined depth in the drift layer 110 through the emitter layer 140, the base layer 130 and the carrier accumulation layer 120. The groove 150 is separately provided for each IGBT unit element 90A.

The gate insulating film 160 is provided on inner surfaces of the groove 150 (more specifically on side surfaces and a bottom surface) but does not fill the groove 150. The gate insulating film 160 can be constituted of a silicon oxide or a silicon nitride for example. The gate electrode 170 is disposed on the gate insulating film 160 to fill the groove 150. The gate electrode 170 can be constituted of polycrystalline silicon or any of various metallic materials for example. The gate electrode 170 is led out at a position not illustrated and connected to a gate pad not illustrated.

A case where the conduction type of the buffer layer 190 is an N-type, more specifically a case where the buffer layer 190 is an N+-type layer having an impurity concentration higher than that in the drift layer 110 is illustrated here. A case where the conduction type of the collector layer 200A is a P-type is also illustrated.

In the example shown in FIG. 4, the semiconductor chip for the IGBT 90A further includes an insulating layer 206, an emitter electrode 204 and a collector electrode 202. The emitter electrode 204 and the collector electrode 202 extend through the plurality of IGBT unit elements and are shared among the unit elements.

The operation of the IGBT 90A will subsequently be outlined.

The on-state of the IGBT 90A will first be described. The on-state is realized by applying a predetermined gate voltage (VGE>0) between the emitter electrode 204 and the gate electrode 170 while a predetermined collector voltage (VCE>0) is being applied between the emitter electrode 204 and the collector electrode 202. In this voltage application mode, an N-type channel is formed in the vicinity of the gate electrode 170 in the base layer 130. The formation of this channel between the emitter layer 140 and the carrier accumulation layer 120 means that electrons can be injected from the emitter electrode 204 into the drift layer 110 through the channel. A forward biased state is established between the drift layer 110 and the collector layer 200A by the injected electrons, and positive holes are injected from the collector layer 200A into the drift layer 110. A current in the IGBT 90A (also called a collector current, an on-current or a principal current for example) is thereby caused to flow between the collector electrode 202 and the emitter electrode 204, in other words, in a thickness direction 103 in the substrate 100A.

The off-state of the IGBT will next be described. The off-state is realized by satisfying gate voltage VGE≤0. In this voltage application mode, the above-described channel disappears and electrons are not injected from the emitter electrode 204 into the drift layer 110. Since electrons are not injected, positive holes also are not injected from the collector layer 200A. As a result, no current flows.

The multilayer structure formed of the gate electrode 170, the gate insulating film 160 and the base layer 130 (recognized to be stacked in a direction perpendicular to the substrate thickness direction 103 as viewed in the sectional view of FIG. 4) forms a so-called MIS structure. The MIS structure is called a metal oxide semiconductor (MOS) structure if the gate insulating film 160 is an oxide film in particular. As can be understood from the operation outline given above, in the MIS structure thus formed, a channel is formed in the base layer 130 to cause a current to flow in the IGBT 90A, and the current is shut off by not forming the channel. That is, a switching element 180 for controlling turning on/off of the current in the IGBT 90A is formed by including the MIS structure.

The switching element 180 is separately provided for each IGBT unit element, as can be understood from the above-described construction. The gate electrodes 170 of the plurality of switching elements 180 are connected in common at a position not illustrated (in other words, in parallel with each other). Therefore, the switching elements 180 are operated in synchronization with each other.

A structure not having the carrier accumulation layer 120 can alternatively be adopted. However, it is preferable to provide the carrier accumulation layer 120 for a reason in the following respect. That is, since the impurity concentration in the carrier accumulation layer 120 is higher than that in the drift layer 110 as described above, the incorporated potential on the junction between the carrier accumulation layer 120 and the base layer 130 is higher than the incorporated potential on the junction between the drift layer 110 and the base layer 130 in the structure not having the carrier accumulation layer 120. Such a higher incorporated potential can be a barrier which prevents positive holes injected from the collector layer 200A into the drift layer 110 from passing to the emitter side. Therefore, positive holes are accumulated in the carrier accumulation layer 120. The carrier concentration on the emitter side is thereby increased, so that the resistance to the on-current (i.e., the on-resistance) is reduced. Also, the collector voltage VCE when the on-current is flowing (i.e., the on-voltage) is reduced.

The buffer layer 190 is provided for the purpose of preventing a punch-through phenomenon in which a depletion layer reaches the collector layer 200A in the off-state, i.e., the withstand voltage holding state. FIG. 4 illustrates a punch through (PT) type of structure. A non punch through (NPT) type of structure not having the buffer layer 190 can alternatively be adopted.

[Operation of the Device and Circuit in Embodiment 1]

(Non-Saturation Voltage Due to Short Circuit)

In the inverter device 10, there is a possibility of flowing of a short circuit current due to one of causes (short circuit modes) described below. A short circuit current (large current, excess current) flows in the IGBT as a result of the occurrence of one of these modes.

(Cause 1) The occurrence of a short circuit as an arm short circuit as a result of breakage of the IGBT (e.g., one of IGBTs 30 and 31) at one side of the arm circuit or breakage of the freewheel diode FWD1 or FWD2

Figure 5:
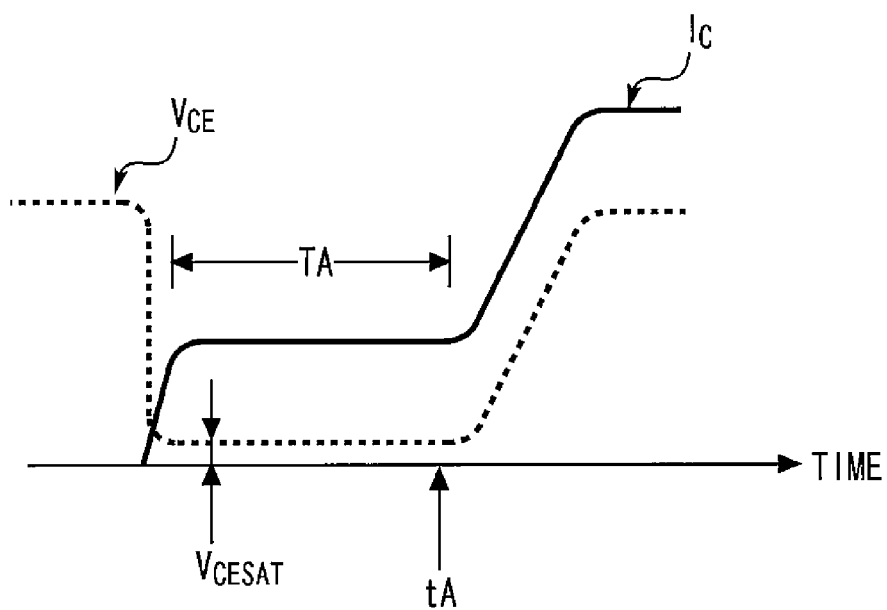
FIG. 5 is a diagram showing an output characteristic of the IGBT driven by the driving device for semiconductor elements according to Embodiment 1 of the present invention.

(Cause 2) The occurrence of an arm short circuit as a result of turning on of both the two IGBTs constituting the arm circuit (e.g., IGBT 30 and IGBT 31) caused by a malfunction of the gate drive circuit or a control signal (Cause 3) Output short circuit fault (Cause 4) Ground fault FIG. 5 is a diagram showing an output characteristic of the IGBT driven by the driving device for semiconductor elements according to Embodiment 1 of the present invention. As shown in this output characteristic, the collector-emitter voltage VCE first lowers with increase in collector current IC after turn-on, finally dropping to a saturation voltage VCESAT. Thereafter, in a normal region TA, each of the collector-emitter voltage VCE and the collector current IC is constant. However, at time to at which an excess current starts flowing, the collector current IC increases and a large current flows. Also, VCE rises after becoming equal to the saturation voltage and becomes a non-saturation voltage.

The desat detection function according to the present embodiment is a function to detect the generation of a short circuit current by detecting a non-saturation voltage which occurs after temporarily becoming the saturation voltage after turn-on. A sequence of desat detection operations during ordinary operation and at the time of desat detection (at the occurrence of a short circuit when the IGBT is turned on) will be described below.

(Normal Operation)

Figure 6:
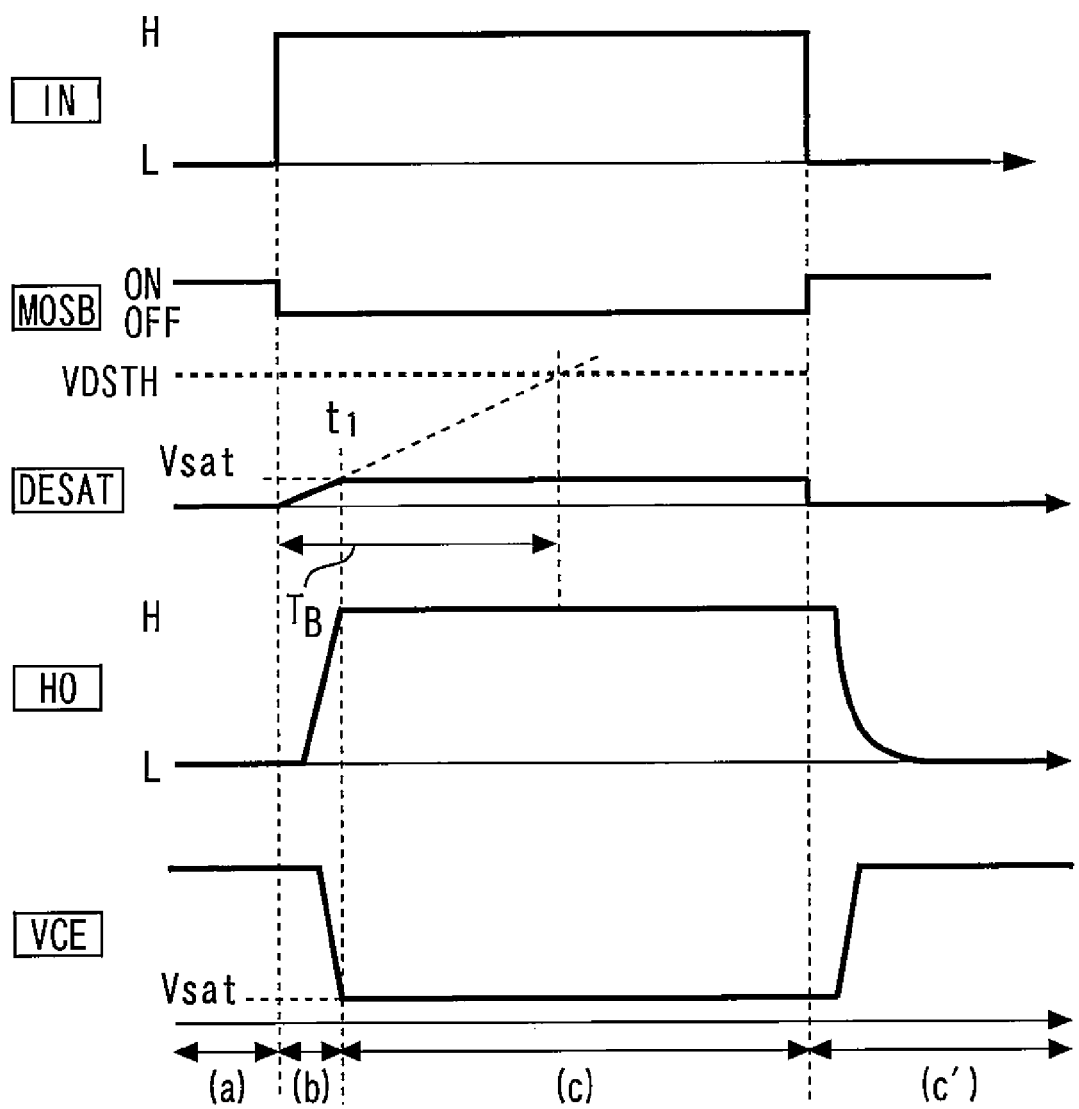
FIG. 6 is a time chart showing the operation in an ordinary situation in the driving device for semiconductor elements according to Embodiment 1 of the present invention.

FIG. 6 is a time chart showing the operation in an ordinary situation in the driving device for semiconductor elements according to Embodiment 1 of the present invention. The time chart in FIG. 6 shows changes between high H and low L in the signal at the terminal IN, turning on and off of the transistor MOSB, changes in the value of voltage on the desat terminal, changes between high H and low L in the signal at the terminal HO and changes in the value of the collector-emitter voltage VCE. The operation of the arrangement at the high side will be descried in the description of the present embodiment. However, the same operation is executed with the arrangement at the low side. The same can also be said with respect to the operation in each of Embodiment 2 and other subsequent embodiments.

Time Period (a)

Time period (a) shown in FIG. 6 is a time period during which the input signal is not supplied to the input terminal HIN of the HVIC 20*a,* that is, the voltage on the terminal HIN is low. During this time period, the transistor MOSB is on, the blanking capacitive element CB1 is discharged, and the potential on the desat terminal VDSH is a low voltage. Also, the collector-emitter voltage VCE is a non-saturation voltage.

Time Period (b)

Time period (b) shown in FIG. 6 is a time period during which the input signal is supplied to the input terminal HIN of the HVIC 20*a,* that is, a time period immediately after a rise of the high voltage on the terminal HIN. During this time period, the signal (low voltage) produced by inverting the signal (high voltage) supplied to the terminal HIN is input to the gate of the transistor MOSB in synchronization with the signal to the terminal HIN. By setting the gate to the low voltage, the transistor MOSB is turned off. As a result, charging of the blanking capacitive element CB1 by the constant current produced by the ordinarily operational constant current source IC1 is started. After a lapse of some delay time period, issue of the output signal having the high voltage from the terminal HO of the HVIC 20*a* is started. The IGBT 30 is turned on according to the high voltage on the terminal HO, and the collector-emitter voltage VCE of the IGBT 30 lowers to the saturation voltage (Vsat). During this transition, a time period exists during which the IGBT 30 is off while the input signal is high. During this time period, the collector-emitter voltage VCE is a non-saturation voltage.

Time Period (c)

Time period (c) is a time period after the rise of the voltage on the desat terminal VDSH to Vsat caused by charging of the blanking capacitive element CB1 after the rise of the voltage on the terminal HIN to the high voltage. During this time period, the voltage on the desat terminal VDSH is clamped at the voltage Vsat by the high-withstand-voltage diode DHV1.

Reference character TB in FIG. 6 represents the above-described blanking time. The blanking time determined by the constant current and the blanking capacitance is realized with the blanking capacitive element CB1, as described above. That is, charging through the desat terminal VDSH is started at the beginning of time period (b). While charging is performed at a gradient (a rate) indicated by a dotted line in FIG. 6, it takes the blanking time indicated by TB in FIG. 6 for the voltage on the desat terminal VDSH to reach the desat threshold voltage (VDSTH) by charging. The blanking time is a margin time before voltage on the desat terminal VDSH reaches the desat threshold voltage (VDSTH) by charging.

In time period (b), the input signal IN is the high voltage but the IGBT 30 is off or in the course of turning on and, therefore, the saturation voltage is not yet reached by the collector-emitter voltage VCE. Setting of the blanking time is made for the purpose of avoiding erroneously detecting the non-saturation voltage in time period (b) as a non-saturation voltage due to a short circuit.

Time Period (c')

Time period (c') is a time period after a fall of the input signal on the terminal HIN to the low voltage. The transistor MOSB is turned on according to the fall of the input signal, thereby discharging the blanking capacitive element CB1. The output signal at the terminal HO also falls according to the fall of the input signal, so that the collector-emitter voltage VCE rises from the saturation voltage to be a non-saturation voltage.

(Operation at the Occurrence of Short Circuit)

Figure 7:
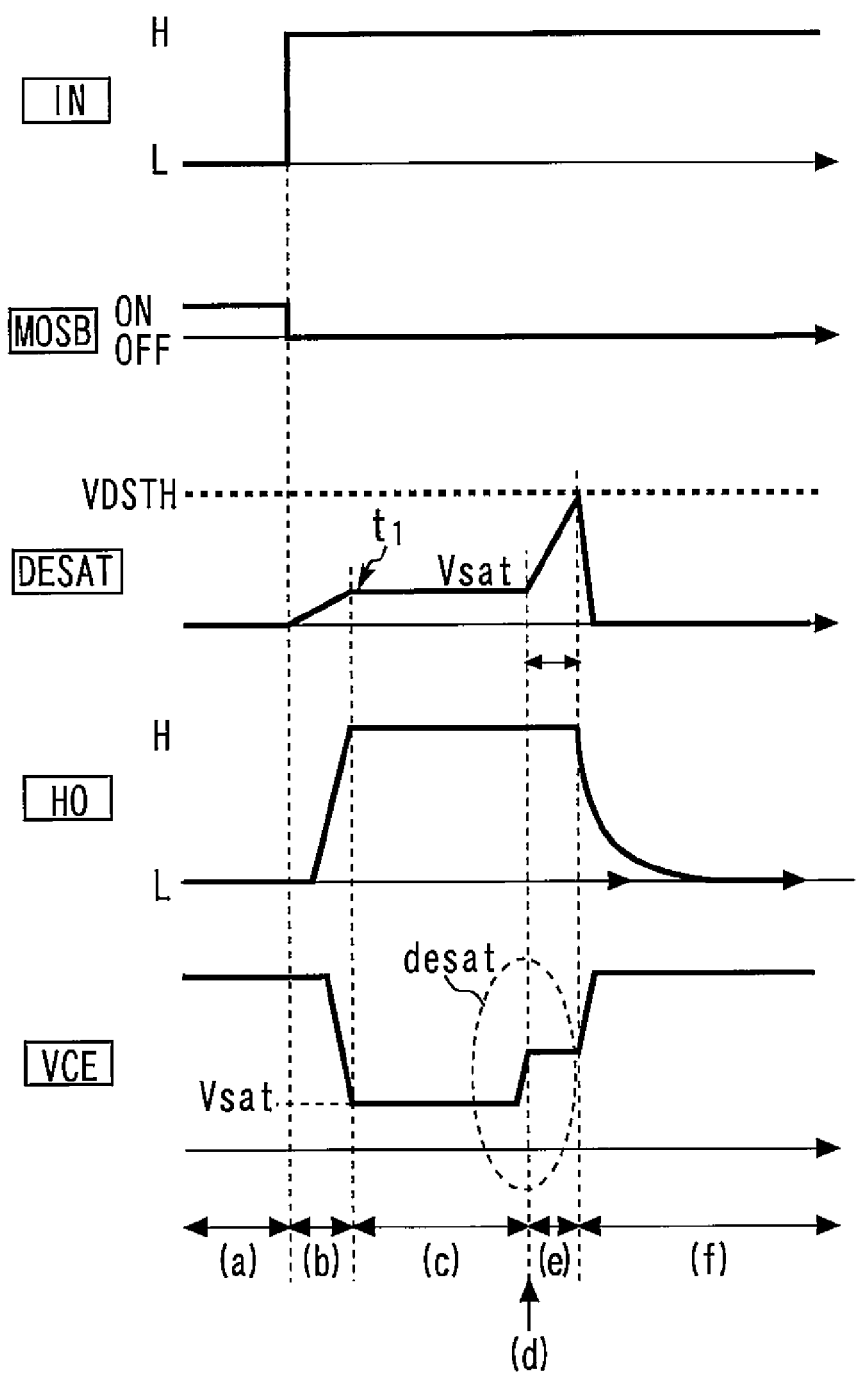
FIG. 7 is a time chart showing the operation at the occurrence of a short circuit (in the event of a short circuit when the IGBT is on) in the driving device for semiconductor elements according to Embodiment 1 of the present invention.

FIG. 7 is a time chart showing the operation at the occurrence of a short circuit (in the event of a short circuit when the IGBT is on) in the driving device for semiconductor elements according to Embodiment 1 of the present invention. The operation of the arrangement at the high side will be descried in the description of the present embodiment. However, the same operation is executed with the arrangement at the low side. The same can also be said with respect to the operation in each of Embodiment 2 and other subsequent embodiments.

The operation in the time periods (a), (b), and (c) is the same as that in an ordinary situation shown in FIG. 6.

Timed Point t1

Timed point t1 is a time corresponding to the boundary between time period (b) and time period (c).

With the arrangement of the charging circuit section 24 according to Embodiment 1, the constant current from the ordinarily operational constant current source IC1 can be supplied to the connection point 15 during time period (b) during which the voltage at which the blanking capacitive element CB1 is charged is lower than Vsat (=saturation voltage).

As described above, the arrangement of the charging circuit section 24 according to Embodiment 1 includes the constant current supply section 26. The constant current supply section 26 can change the current source for supply of current to the connection point 15 from the ordinarily operational constant current source IC1 to the rapid charging constant current source IC2 when the voltage at which the blanking capacitive element CB1 is charged becomes equal to Vsat (=saturation voltage). This changing is performed at the timed point t1.

After the timed point t1 at which the voltage at which the blanking capacitive element CB1 is charged becomes equal to Vsat (=saturation voltage), i.e., in time period (c), the constant current from the rapid charging constant current source IC2 can be supplied to the connection point 15. However, even after the current source for supply of current to the connection point 15 is changed to the rapid charging constant current source IC2 in the charging circuit section 24, the voltage on the desat terminal VDSH is still clamped at Vsat if the IGBT 30 has a non-saturation voltage.

Time (d)

Time (d) represents a time when the collector-emitter voltage VCE becomes a non-saturation voltage as a result of the occurrence of a short circuit while the IGBT 30 is in the on-state. When a short-circuit occurs during the on-state of the IGBT 30, the voltage between the collector and the emitter of the IGBT 30 is expanded. That is, the collector-emitter voltage VCE rises to be a non-saturation voltage, as indicated in a region surrounded by a broken line desat in FIG. 7. At this time, the voltage on the desat terminal VDSH clamped at Vsat is unclamped.

Time Period (e)

Time period (e) is a time period during which the blanking capacitive element CB1 is further charged with the constant current from the rapid charging constant current source IC2.

The supply of current to the connection point 15 is changed at timed point t1 so that the current is produced by the rapid charging constant current source IC2, as described above. Therefore, as shown in FIG. 7, the blanking capacitive element CB1 is charged at a higher rate (steeper gradient) in time period (e) than in time period (b), and the voltage on the desat terminal VDSH rises further.

Time Period (f)

Time period (f) is a time period in which the voltage on the desat terminal VDSH exceeds the value of the desat threshold voltage. In this case, the above-described shutting circuit section 28 determines that a non-saturation voltage in the IGBT 30 has been detected, and shuts off the signal output from the terminal HO (that is, forcibly reduces the signal output to the low voltage).

(Functions and Advantages of Embodiment 1)

In the desat detection circuit section 22, the blanking time is set with the blanking capacitive element CB1. The mechanism using the blanking time is such that the detection of a non-saturation voltage is not immediately recognized as the occurrence of a short circuit; if a time period during which a non-saturation voltage is detected in the on-state after turn-on exceeds the blanking time, it is determined that the occurrence of a short circuit is sensed.

This blanking time setting enables avoidance of erroneous detection of the normal non-saturation voltage state immediately after turn-on. However, this blanking time also has an influence even when a short circuit occurs during the operation in the on-state of the IGBT 30 after the saturation voltage is once reached after turn-on.

In this respect, in the present embodiment, an increase in the collector-emitter voltage VCE from the saturation voltage (non-saturation) once the saturation voltage is reached by the collector-emitter voltage VCE is considered to be due to a short circuit, thereby enabling the blanking capacitive element CB1 to be charged earlier with the rapid charging constant current source IC2. In such a case, the blanking capacitive element CB1 is rapidly pulled up to the desat threshold value (VDSTH) by being charged at a higher rate, thus enabling earlier shutting of the IGBT 30 in the event of a short circuit. In other words, the blanking time can be shortened. As a result, protection of the IGBT 30 can be rapidly performed at the occurrence of a short circuit.

[Comparative Example for Embodiment]

Figure 21:
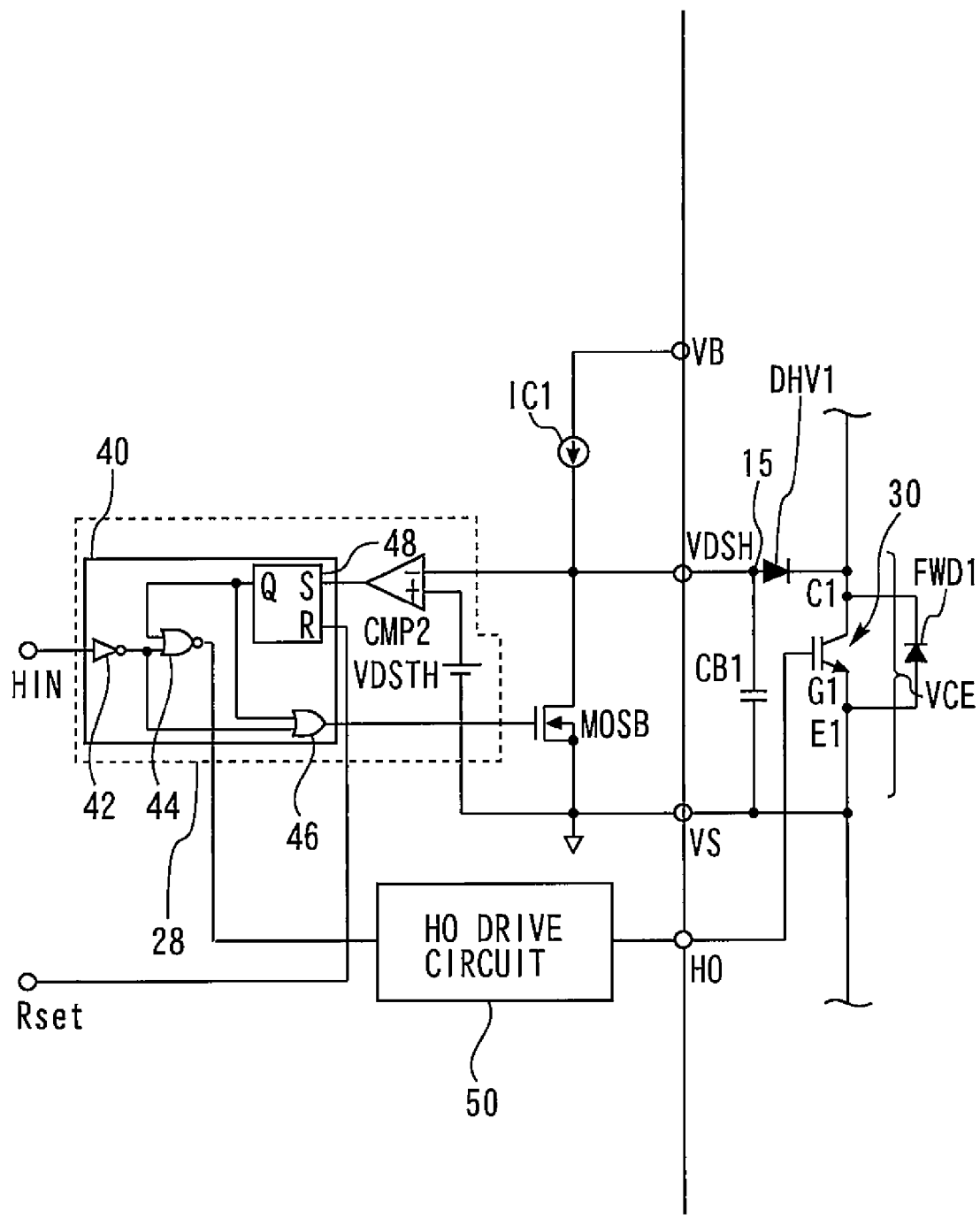
FIG. 21 is a diagram showing a driving device for semiconductor elements according to a comparative example for the embodiment of the present invention.

FIG. 21 is a diagram showing a driving device for semiconductor elements according to a comparative example for the embodiment of the present invention. The driving circuit according to the comparative example has the same configuration as that of the driving device for semiconductor elements according to Embodiment 1 except for a different circuit configuration of the charging circuit section 24.

The driving circuit according to the comparative example shown in FIG. 21 differs from Embodiment 1 in that the comparator CMP1, the rapid charging constant current source IC2 and the switch section SW are not provided. That is, charging of the blanking capacitive element CB1 is carried out with only one constant current source in the driving circuit according to the comparative example. It is assumed that in the comparative example the constant current source is the ordinarily operational constant current source IC1 and charging of the blanking capacitive element CB1 is performed with only the first-value constant current.

Figure 22:
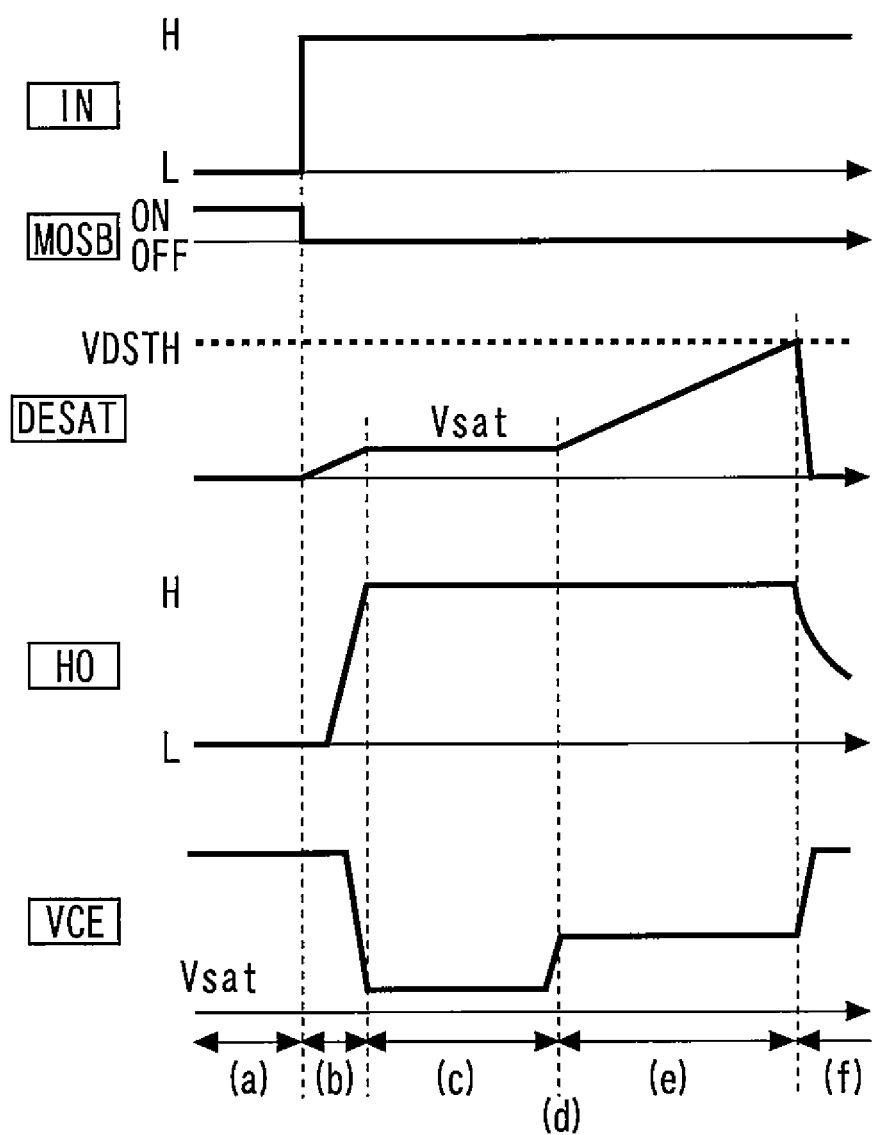
FIG. 22 is a time chart showing the operation at the occurrence of a short circuit (in the event of a short circuit when the IGBT is on) in the driving device for semiconductor elements according to the comparative example for the embodiment of the present invention.

FIG. 22 is a time chart showing the operation at the occurrence of a short circuit (in the event of a short circuit when the IGBT is on) in the driving device for semiconductor elements according to the comparative example for the embodiment of the present invention. A comparison between period (e) in FIG. 22 and period (e) in FIG. 7 is made. It is then understood that period (e) in Embodiment 1 shown in FIG. 7 is shorter. In Embodiment 1, the current supplied to the connection point 15 in period (e) is produced by the rapid charging constant current source IC2 and, therefore, charging is performed at a higher rate in period (e) than in period (b).

Modifications described below may be made in Embodiment 1 described above.

In Embodiment 1 described above, an IGBT is used as a switching element. The present invention, however, is not limited to this. A MOSFET may alternatively be used as a switching element. The same can also be said with respect to embodiments subsequently described.

The shutting circuit section 28 according to Embodiment 1 shuts off the input signal to the HO drive circuit section 50 when the voltage at which the blanking capacitive element CB1 is charged reaches the desat threshold voltage. The present invention, however, is not limited to this. For example, the arrangement may alternatively be such that the output signal from the comparator CMP2 is supplied to the outside of the desat detection circuit section 22 and a host device such as a microcontroller for control receiving this output signal holds the contents of input signals to be supplied to the terminals HIN and LIN at low voltages. The "gate signal shutting protection operation on IGBT 30" may be carried out by such a method. The same can also be said with respect to the embodiments subsequently described.

Embodiment 2

Figure 8:
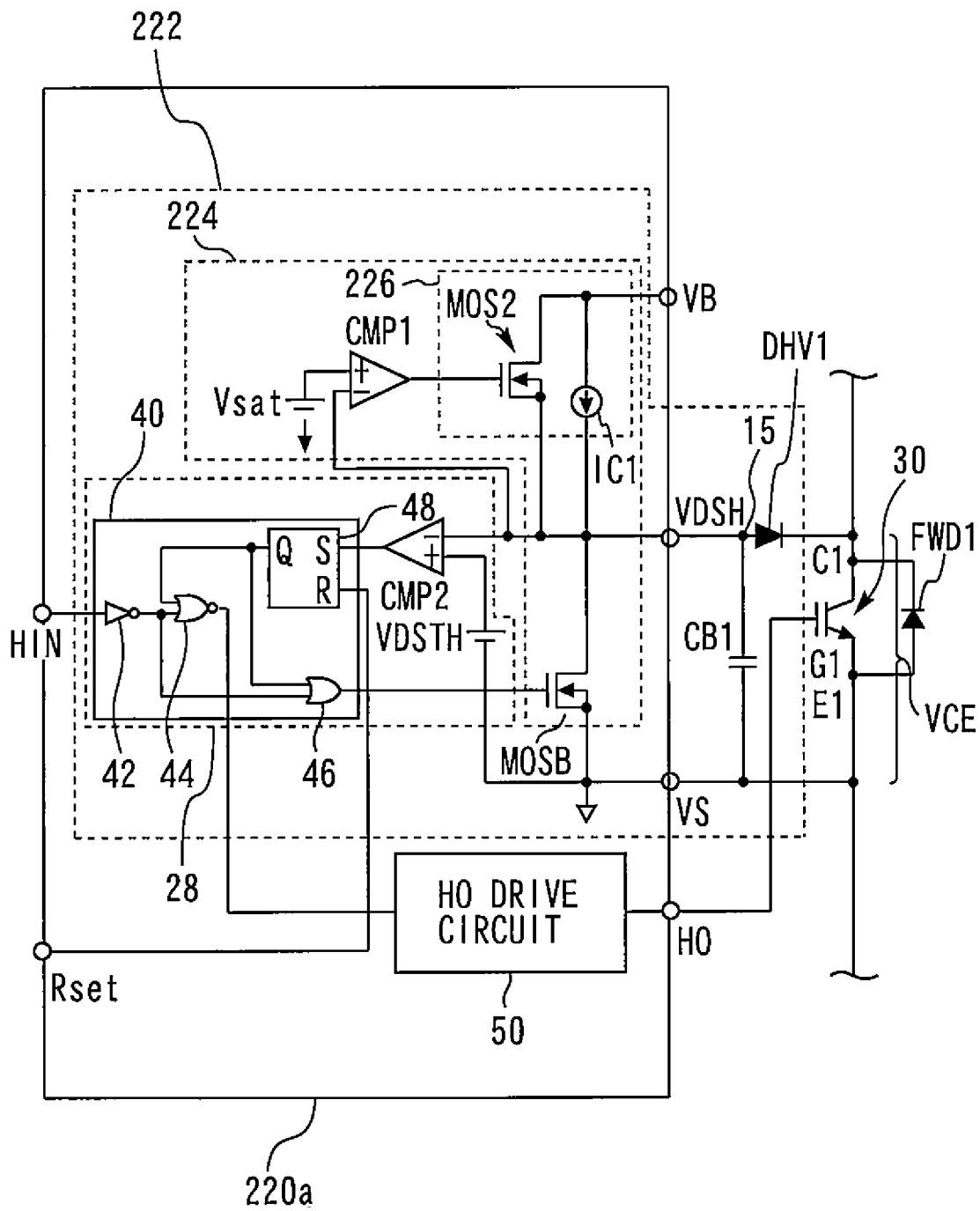
FIG. 8 is a circuit diagram showing the configuration of a driving device for semiconductor elements according to Embodiment 2 of the present invention and components on the periphery of the driving device for semiconductor elements.

FIG. 8 is a circuit diagram showing the configuration of a driving device for semiconductor elements according to Embodiment 2 of the present invention and components on the periphery of the driving device for semiconductor elements. The driving device for semiconductor elements according to Embodiment 2 is HVIC 220a. The HVIC 220a and the external circuit form a desat detection circuit section 222. The desat detection circuit section 222 has the same configuration as that of the desat detection circuit section 22 according to Embodiment 1 except for the configuration of a charging circuit section 224 (constant current supply section 226 in particular).

It is assumed that, except for the above-described points of difference, a semiconductor device according to Embodiment 2 has the same configuration as that of the semiconductor device (inverter device 10) according to Embodiment 1, and that the driving device for semiconductor elements according to Embodiment 2 has the same configuration as that of the driving device for semiconductor elements (drive circuit 14a) according to Embodiment 1.

The constant current supply section 226 includes the ordinarily operational constant current source IC1 and a transistor MOS2. The transistor MOS2 is a MOS transistor connected in parallel with the ordinarily operational constant current source IC1. The gate of the transistor MOS2 is connected to the output terminal of the comparator CMP1. The transistor MOS2 is capable of additionally supplying a current to the blanking capacitive element CB1 by being turned on. The second-value constant current in Embodiment 1 can thereby be produced. That is, the transistor MOS2 functions in place of the rapid charging constant current source IC2 to increase the constant current to the connection point 15 to the second value. A small constant current source which produces an amount of constant current corresponding to the difference between the second value and the first value and a switch for turning on the small constant current source when the output signal from the comparator CMP1 becomes high may be provided in place of the transistor MOS2.

Figure 9:
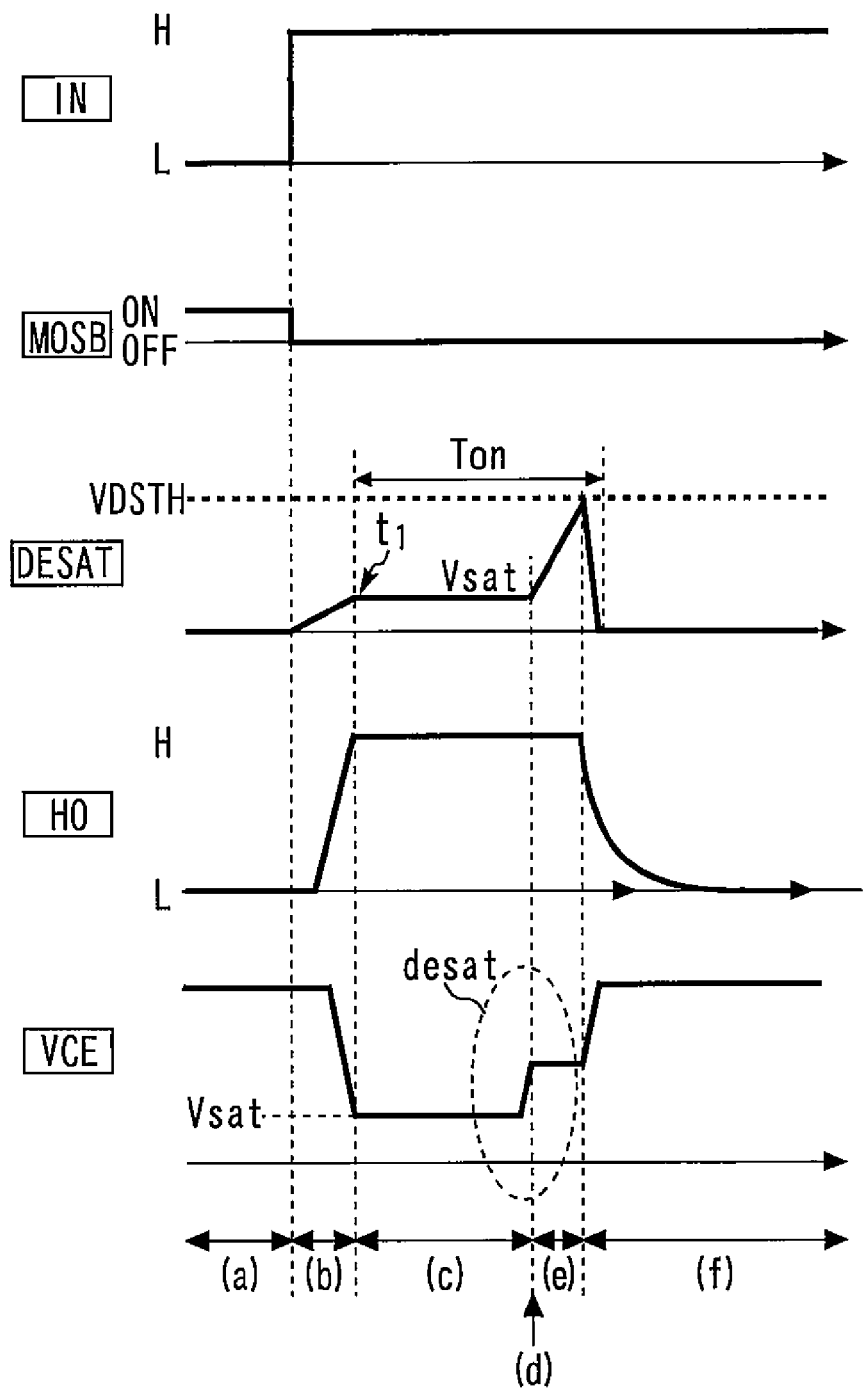
FIG. 9 is a time chart showing the operation at the occurrence of a short circuit (in the event of a short circuit when the IGBT is on) in the driving device for semiconductor elements according to Embodiment 2 of the present invention.

FIG. 9 is a time chart showing the operation at the occurrence of a short circuit (in the event of a short circuit when the IGBT is on) in the driving device for semiconductor elements according to Embodiment 2 of the present invention. FIG. 9 is basically the same as the time chart shown in FIG. 7 but indicates that there is a rapid charging MOS on time period Ton from timed point t1 to the end of period (e). The transistor MOS2 is on during this rapid charging MOS on time period Ton.

In Embodiment 2, a circuit (transistor MOS2) for adding a constant current to the ordinarily operational constant current source IC1 is provided in place of the arrangement for selecting a current source for charging the blanking capacitive element CB1 from a plurality of current sources, thereby enabling the circuit scale to be reduced in comparison with Embodiment 1 when the current value for rapid charging is the same value. The charging current may be not a constant current.

Embodiment 3

Figure 10:
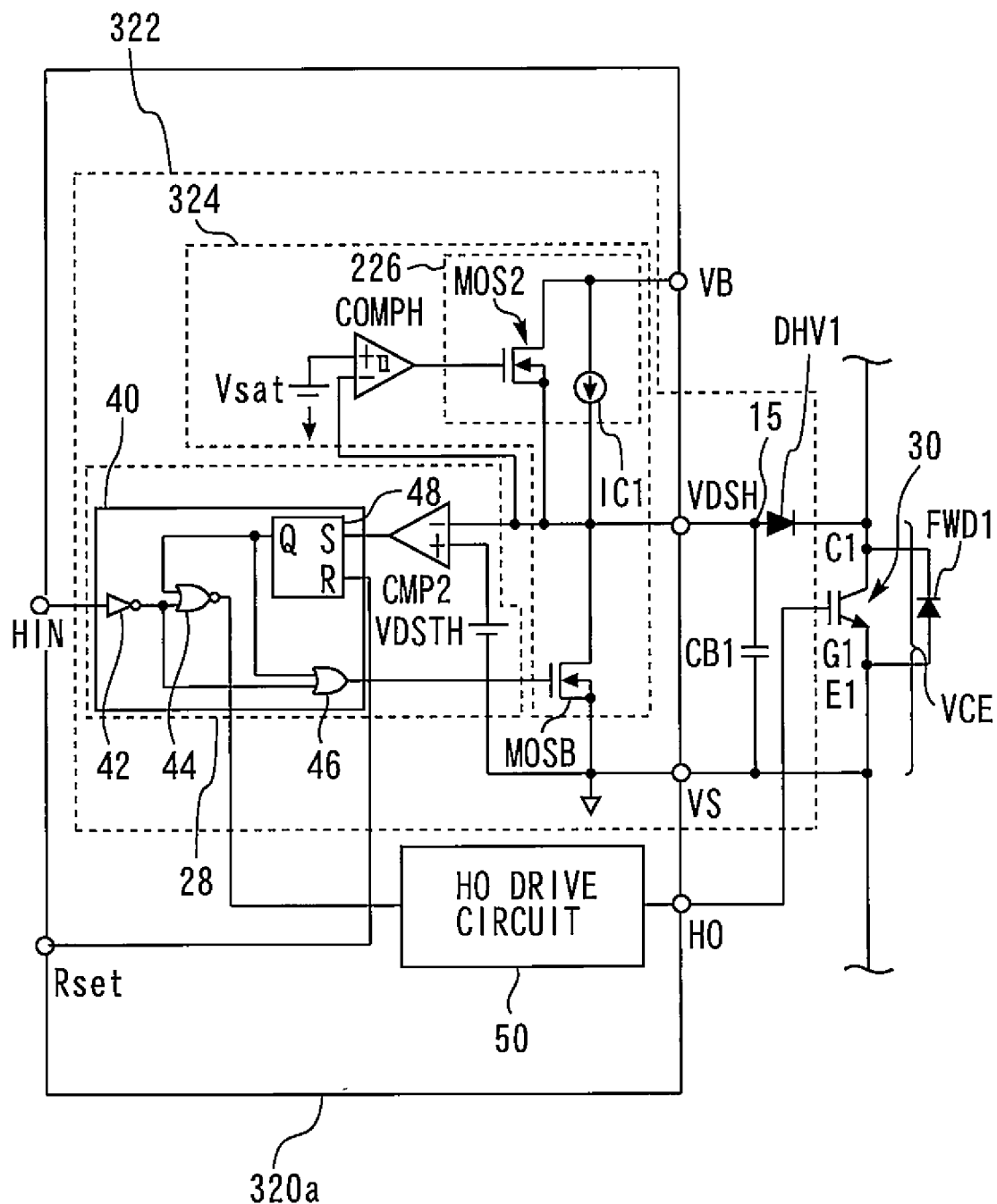
FIG. 10 is a circuit diagram showing the configuration of a driving device for semiconductor elements according to Embodiment 3 of the present invention and components on the periphery of the driving device for semiconductor elements.

FIG. 10 is a circuit diagram showing the configuration of a driving device for semiconductor elements according to Embodiment 3 of the present invention and components on the periphery of the driving device for semiconductor elements. The driving device for semiconductor elements according to Embodiment 3 is HVIC 320a. The HVIC 320a and the external circuit form a desat detection circuit section 322. The HVIC 320a has the same configuration as that of the HVIC 220a according to Embodiment 2 except for the configuration of a charging circuit section 324. The charging circuit section 324 has the same configuration as that of the charging circuit section 224 except for a hysteretic comparator CMPH substituted for the comparator CMP1.

It is assumed that, except for the above-descried points of difference, a semiconductor device according to Embodiment 3 has the same configuration as that of the semiconductor device according to Embodiment 2, and that, with the same exceptions, the driving device for semiconductor elements according to Embodiment 3 has the same configuration as that of the driving device for semiconductor elements according to Embodiment 2.

Figure 11:
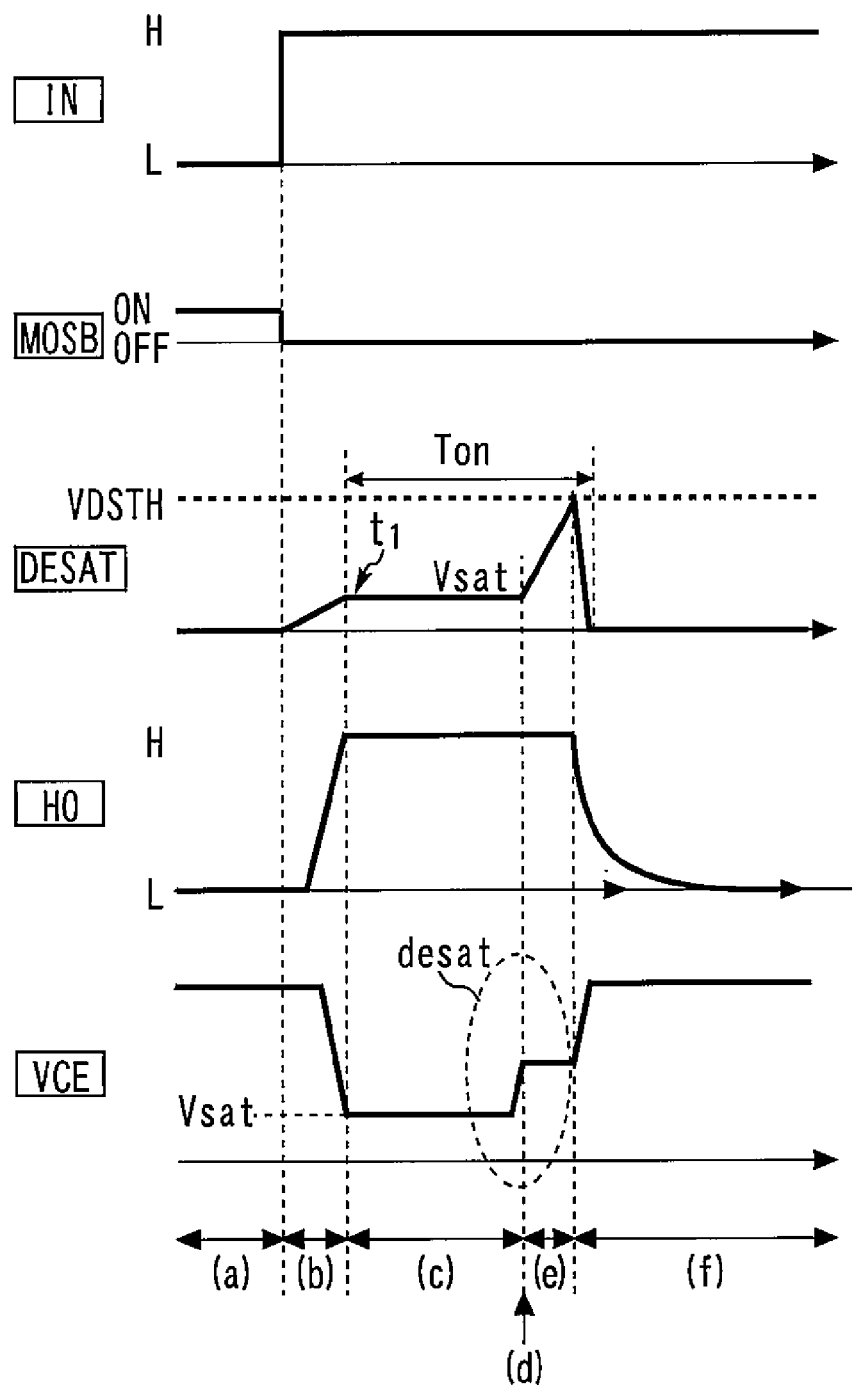
FIG. 11 is a time chart showing the operation at the occurrence of a short circuit (in the event of a short circuit when the IGBT is on) in the driving device for semiconductor elements according to Embodiment 3 of the present invention.

FIG. 11 is a time chart showing the operation at the occurrence of a short circuit (in the event of a short circuit when the IGBT is on) in the driving device for semiconductor elements according to Embodiment 3 of the present invention. In Embodiment 3, FIG. 11 is basically the same as the time chart shown in FIG. 7, but the comparator CMP1 is replaced with the hysteretic comparator CMPH. Use of the hysteretic comparator ensures that rapid charging (maintaining the transistor MOS2 in the on-state) can be continued even when the voltage on the desat terminal VDSH is temporarily made lower than Vsat by noise for example. Noise immunity can be improved in this way in comparison with the charging circuit section 224 according to Embodiment 2. The on time period Ton during which the transistor MOS2 for rapid charging is increased in comparison with that in Embodiment 2 by the hysteresis of the comparator.

The arrangement according to Embodiment 3 presupposes the arrangement according to Embodiment 2 and has the hysteretic comparator CMPH in place of the comparator CMP1. The present invention, however, is not limited to this. The comparator CMP1 may be replaced with the hysteretic comparator CMPH in the arrangement according to Embodiment 1 (FIG. 3). That is, the constant current supply section 226 may be replaced with the constant current supply section 26.

Embodiment 4

Figure 12:
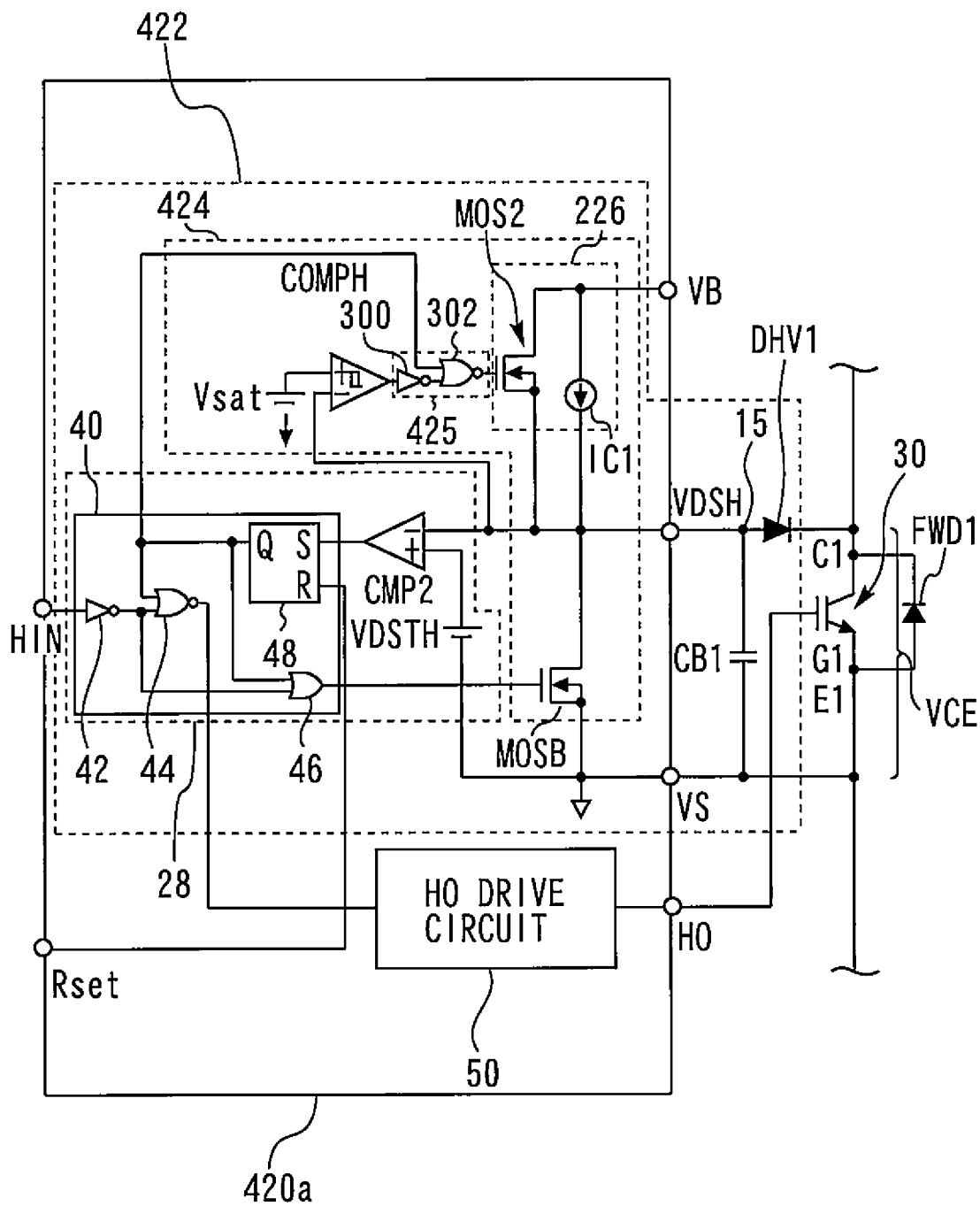
FIG. 12 is a circuit diagram showing the configuration of a driving device for semiconductor elements according to Embodiment 4 of the present invention and components on the periphery of the driving device for semiconductor elements.

FIG. 12 is a circuit diagram showing the configuration of a driving device for semiconductor elements according to Embodiment 4 of the present invention and components on the periphery of the driving device for semiconductor elements. The driving device for semiconductor elements according to Embodiment 4 is HVIC 420a. The HVIC 420a and the external circuit form a desat detection circuit section 422. The HVIC 420a has the same configuration as that of the HVIC 320a according to Embodiment 3 except for the configuration of a charging circuit section 424. The charging circuit section 424 has the same configuration as that of the charging circuit section 324 except for the provision of a stop circuit section 425 between the hysteretic comparator CMPH and the transistor MOS2.

It is assumed that, except for the above-descried points of difference, a semiconductor device according to Embodiment 4 has the same configuration as that of the semiconductor device according to Embodiment 3, and that, with the same exceptions, the driving device for semiconductor elements according to Embodiment 4 has the same configuration as that of the driving device for semiconductor elements according to Embodiment 3.

The shutting circuit section 28 includes the comparator CMP2 and the desat protection circuit section 40, as described above. The comparator CMP2 sets its output signal to the high voltage when the voltage on the desat terminal VDSH reaches the desat threshold voltage (VDSTH). This high voltage serves as "short circuit detection signal", as described above. The desat protection circuit section 40 receives the short circuit detection signal from the comparator CMP2 and shuts off the input of the input signal from the terminal HIN side to the HO drive circuit section 50.

The stop circuit section 425 is a circuit in which a NOT circuit 300 and a NOR circuit 302 are successively connected in series. The NOT circuit 300 receives an input from the output terminal of the hysteretic comparator CMPH and inputs an inverted signal to the NOR circuit 302. The NOR circuit 302 receives the output from the NOT circuit 300 and the output Q from the latch circuit 48 and outputs the result of a NOT logic operation on the values of these outputs to the gate of the transistor MOS2.

When the output from the comparator CMP2 becomes the high voltage (that is, when the short circuit detection signal is issued), the output Q from the latch circuit 48 is held at the high voltage. Then the output from the NOR circuit 302 is held at the low voltage irrespective of whether the output signal from the hysteretic comparator CMPH is the high voltage or the low voltage, and the transistor MOS2 is turned off. Thus, the stop circuit section 425 can turn off the transistor MOS2 to stop the increase in the current to the connection point 15 when the short-circuit detection signal is issued, regardless of the output signal from the hysteresis comparator CMPH.

Figure 13:
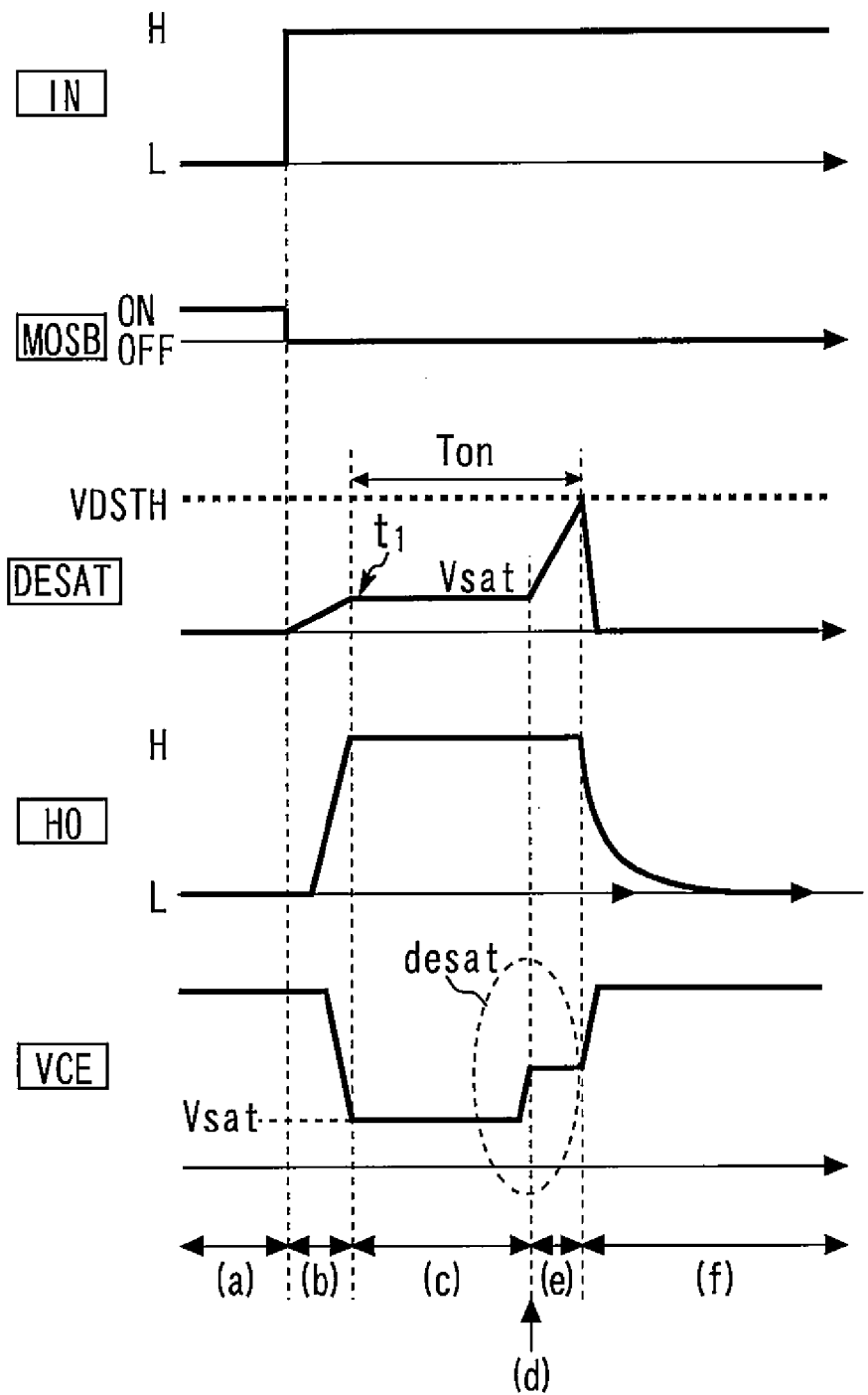
FIG. 13 is a time chart showing the operation at the occurrence of a short circuit (in the event of a short circuit when the IGBT is on) in the driving device for semiconductor elements according to Embodiment 4 of the present invention.

FIG. 13 is a time chart showing the operation at the occurrence of a short circuit (in the event of a short circuit when the IGBT is on) in the driving device for semiconductor elements according to Embodiment 4 of the present invention. FIG. 13 is basically the same as the time chart shown in FIG. 11, but the "rapid charging MOS on time period" is shorter than that shown in FIG. 11. The "rapid charging MOS on time period" is a time period during which the transistor MOS2 is on. In FIG. 11, i.e., the time chart in Embodiment 3, the "rapid charging MOS on time period" extends to a point in period (f). In contrast, in FIG. 13, i.e., the time chart in Embodiment 4, the "rapid charging MOS on time period" ends at the end of period (e).

In Embodiment 4, as described above, the short circuit detection signal can be used as a signal for turning off the transistor MOS2 for rapid charging, so that the transistor MOS2 can be turned off immediately after detection of a short circuit. The transistor MOS2 on time period can thus be shortened to reduce the circuit current in comparison with Embodiment 3.

The arrangement according to Embodiment 4 presupposes the arrangement according to Embodiment 3 and has the stop circuit section 425 provided between the hysteretic comparator CMPH and the transistor MOS2. The present invention, however, is not limited to this. The stop circuit section 425 may be provided between the comparator CMP1 and the transistor MOS2 in the arrangement according to Embodiment 2 (FIG. 8).

Also, the constant current supply section 226 may be replaced with the constant current supply section 26.

Embodiment 5

Figure 14:
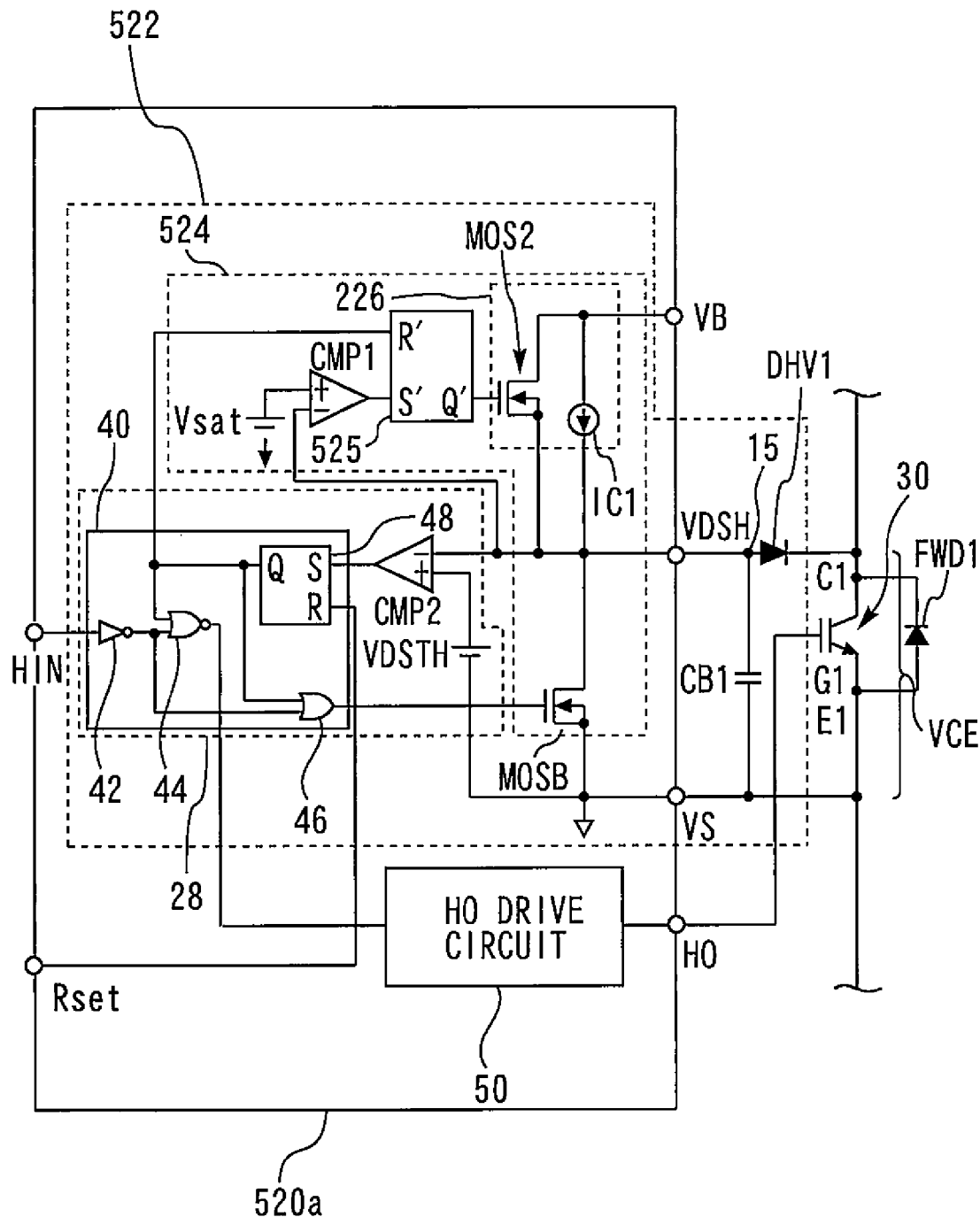
FIG. 14 is a circuit diagram showing the configuration of a driving device for semiconductor elements according to Embodiment 5 of the present invention and components on the periphery of the driving device for semiconductor elements.

FIG. 14 is a circuit diagram showing the configuration of a driving device for semiconductor elements according to Embodiment 5 of the present invention and components on the periphery of the driving device for semiconductor elements. The driving device for semiconductor elements according to Embodiment 5 is HVIC 520a. The HVIC 520a and the external circuit form a desat detection circuit section 522. The HVIC 520a has the same configuration as that of the HVIC 220a according to Embodiment 2 except for the configuration of a charging circuit section 524. The charging circuit section 524 has the same configuration as that of the charging circuit section 224 except for the provision of a latch circuit section 525 between the comparator CMP1 and the transistor MOS2. In the driving device for semiconductor elements according to Embodiment 5, the short circuit detection signal is used as a rapid charging MOS off signal (i.e., a signal for resetting the latch circuit section 525), as is that in Embodiment 4.

It is assumed that, except for the above-descried points of difference, a semiconductor device according to Embodiment 5 has the same configuration as that of the semiconductor device according to Embodiment 2, and that, with the same exceptions, the driving device for semiconductor elements according to Embodiment 5 has the same configuration as that of the driving device for semiconductor elements according to Embodiment 2.

The output terminal of the comparator CMP1 is connected to an S' terminal of the latch circuit section 525. The output Q from the latch circuit 48 is input to an R' terminal of the latch circuit section 525. The latch circuit section 525 sets an output Q' to a high voltage upon receiving the output signal from the comparator CMP1. When the output Q' from the latch circuit section 525 is held high, the transistor MOS2 is held in the on-state, thus enabling the constant current supply section 226 to maintain the "state of supplying the second-value constant current".

Figure 15:
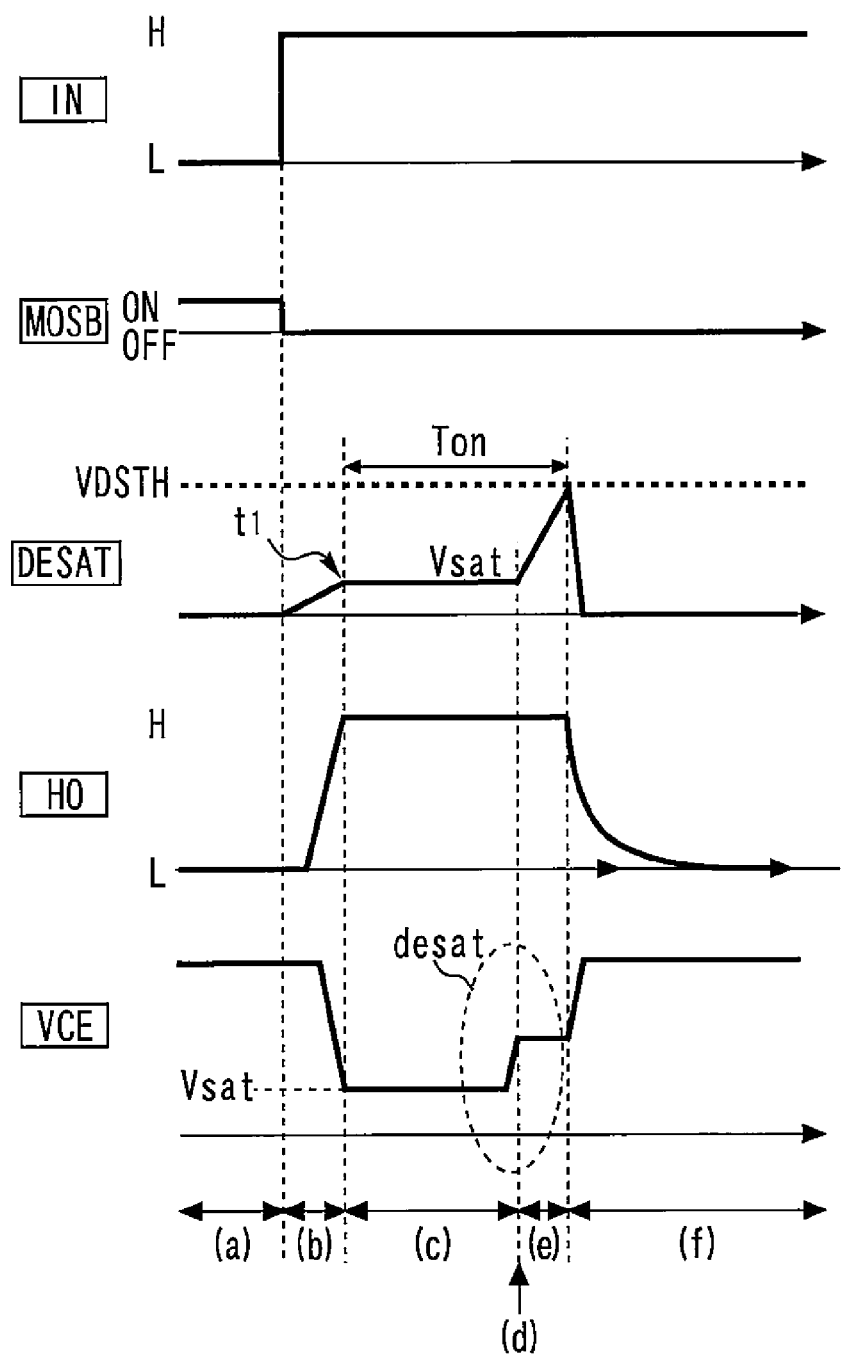
FIG. 15 a time chart showing the operation at the occurrence of a short circuit (in the event of a short circuit when the IGBT is on) in the driving device for semiconductor elements according to Embodiment 5 of the present invention.

FIG. 15 a time chart showing the operation at the occurrence of a short circuit (in the event of a short circuit when the IGBT is on) in the driving device for semiconductor elements according to Embodiment 5 of the present invention. FIG. 15 is basically the same as the time chart shown in FIG. 13. Use of the latch circuit section 525 ensures that the transistor MOS2 for rapid charging can be maintained in the on-state from timed point t1 at which the voltage on the desat terminal VDSH temporarily rises to Vsat. Noise immunity can thereby be improved in comparison with Embodiment 4.

The arrangement according to Embodiment 5 presupposes the arrangement according to Embodiment 2 and has the latch circuit section 525 provided between the comparator CMP1 and the transistor MOS2. The present invention, however, is not limited to this. The latch circuit section 525 may be provided between the hysteretic comparator CMPH and the transistor MOS2 in the arrangement according to Embodiment 3 (FIG. 10).

Also, the constant current supply section 226 may be replaced with the constant current supply section 26.

Embodiment 6

Figure 16:
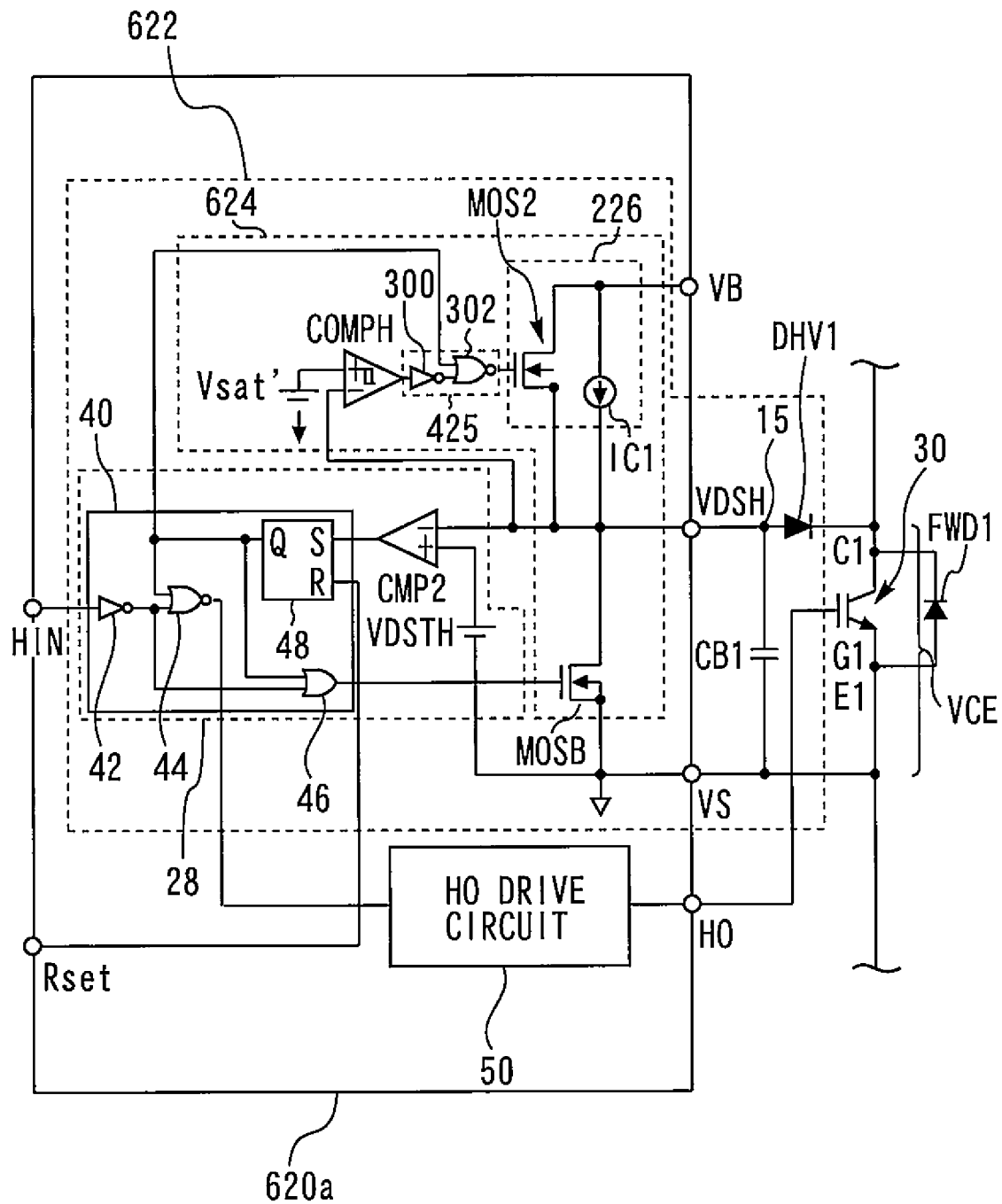
FIG. 16 is a circuit diagram showing the configuration of a driving device for semiconductor elements according to Embodiment 6 of the present invention and components on the periphery of the driving device for semiconductor elements.

FIG. 16 is a circuit diagram showing the configuration of a driving device for semiconductor elements according to Embodiment 6 of the present invention and components on the periphery of the driving device for semiconductor elements. The driving device for semiconductor elements according to Embodiment 6 is HVIC 620a. The HVIC 620a and the external circuit form a desat detection circuit section 622. The HVIC 620a has the same configuration as that of the HVIC 420a according to Embodiment 4 except for the configuration of a charging circuit section 624. The charging circuit section 624 has the same configuration as that of the charging circuit section 424, except that the input voltage to the positive terminal of the hysteretic comparator CMPH (reference voltage) is changed to Vsat'. This reference voltage Vsat' is set lower than the saturation voltage of the IGBT 30 and is set lower than the voltage Vsat in Embodiments 1 to 5.

It is assumed that, except for the above-descried points of difference, a semiconductor device according to Embodiment 6 has the same configuration as that of the semiconductor device according to Embodiment 4, and that, with the same exceptions, the driving device for semiconductor elements according to Embodiment 6 has the same configuration as that of the driving device for semiconductor elements according to Embodiment 4.

Figure 17:
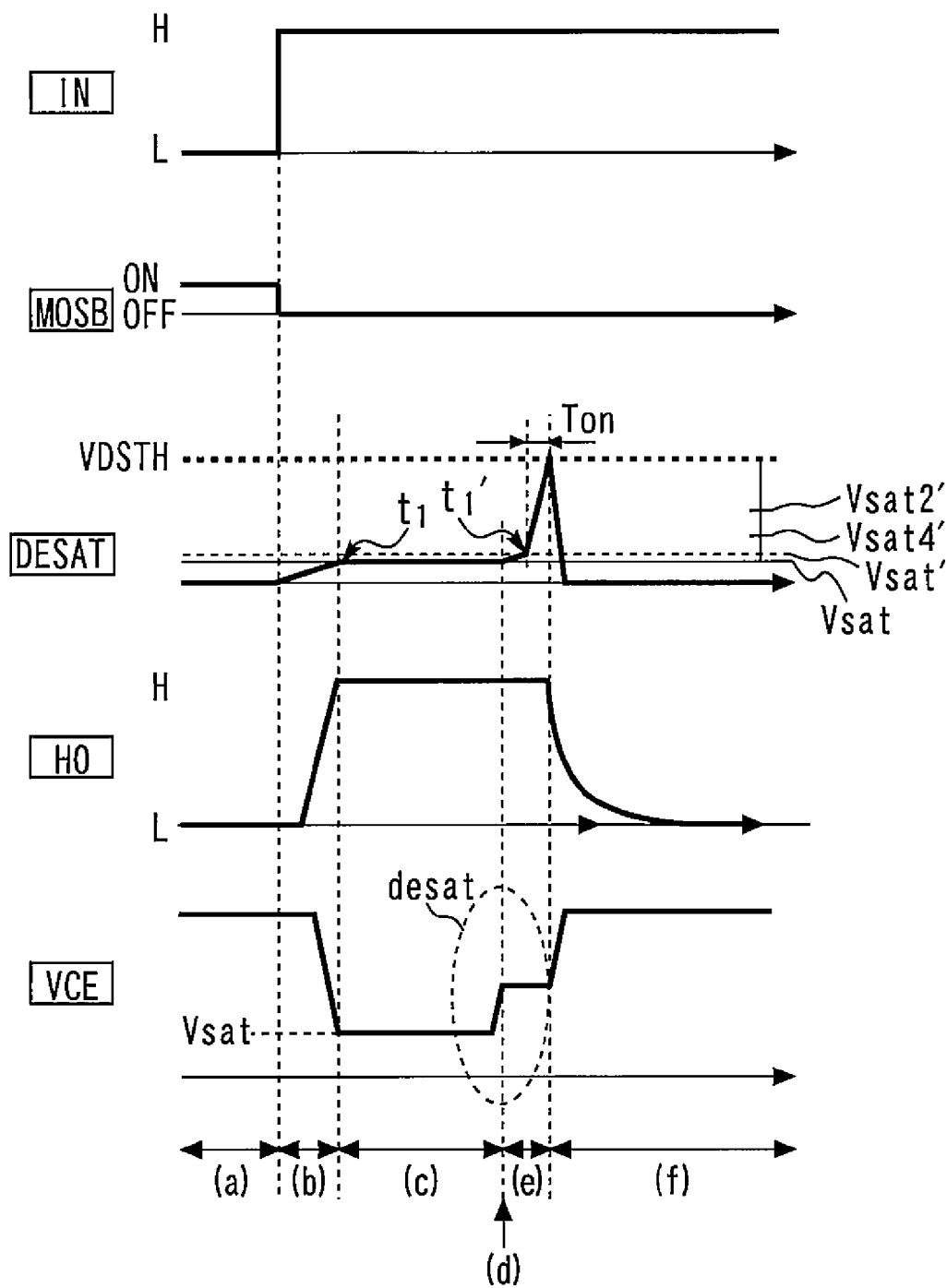
FIG. 17 is a time chart showing the operation at the occurrence of a short circuit (in the event of a short circuit when the IGBT is on) in the driving device for semiconductor elements according to Embodiment 6 of the present invention.

FIG. 17 is a time chart showing the operation at the occurrence of a short circuit (in the event of a short circuit when the IGBT is on) in the driving device for semiconductor elements according to Embodiment 6 of the present invention. In the driving device for semiconductor elements according to Embodiment 6, the timing for increasing the rate of charging of the blanking capacitive element CB1 (the timing for increasing the current supplied to the connection point 15) is a timed point t' slightly after the beginning of period (e). Embodiment 6 differs from Embodiments 1 to 5 in this respect.

The threshold voltage at which a switch to rapid charging is made can be set to a value higher than the saturation voltage (Vsat) and lower than the desat threshold voltage (VDSTH) by inputting Vsat' (Vsat>Vsat') to the positive terminal of the hysteretic comparator CMPH. The transistor MOS2 for rapid charging is therefore maintained in the off-state even after the desat terminal VDSH is clamped at the voltage Vsat. In the event of detection of a short circuit, the transistor MOS2 for rapid charging is maintained in the off-state while the voltage on the desat terminal VDSH changes from Vsat to Vsat'. The rate of charging of the blanking capacitive element CB1 is therefore reduced and the short circuit detection time is delayed. However, if the Vsat' is set to a value close to Vsat, it is possible to shorten the on time for the transistor MOSB for rapid charging while maintaining substantially the same short circuit detection speed. The transistor MOSB on time period can thus be shortened to reduce the circuit current in comparison with Embodiments 1 to 5.

A modified example of the present embodiment is such that the value of Vsat' may be set, for example, equal to or smaller than Vsat 2' in FIG. 17. Vsat 2' is an "intermediate voltage value between Vsat and the desat threshold voltage". Also, the value of Vsat' may be set equal to or smaller than Vsat 4' in FIG. 17. Vsat 4' is a "voltage value obtained by multiplying the sum of Vsat and the desat threshold voltage by ¼".

The arrangement according to Embodiment 6 presupposes the arrangement according to Embodiment 4 and has the input voltage to the positive terminal of the hysteretic comparator CMPH (reference voltage) changed to Vsat'. The present invention, however, is not limited to this. The input voltage to the positive terminal of the hysteretic comparator CMPH (reference voltage) in the arrangement according to Embodiment 3 (FIG. 10) may be changed to Vsat'.

Also, the constant current supply section 226 may be replaced with the constant current supply section 26.

Embodiment 7

Figure 18:
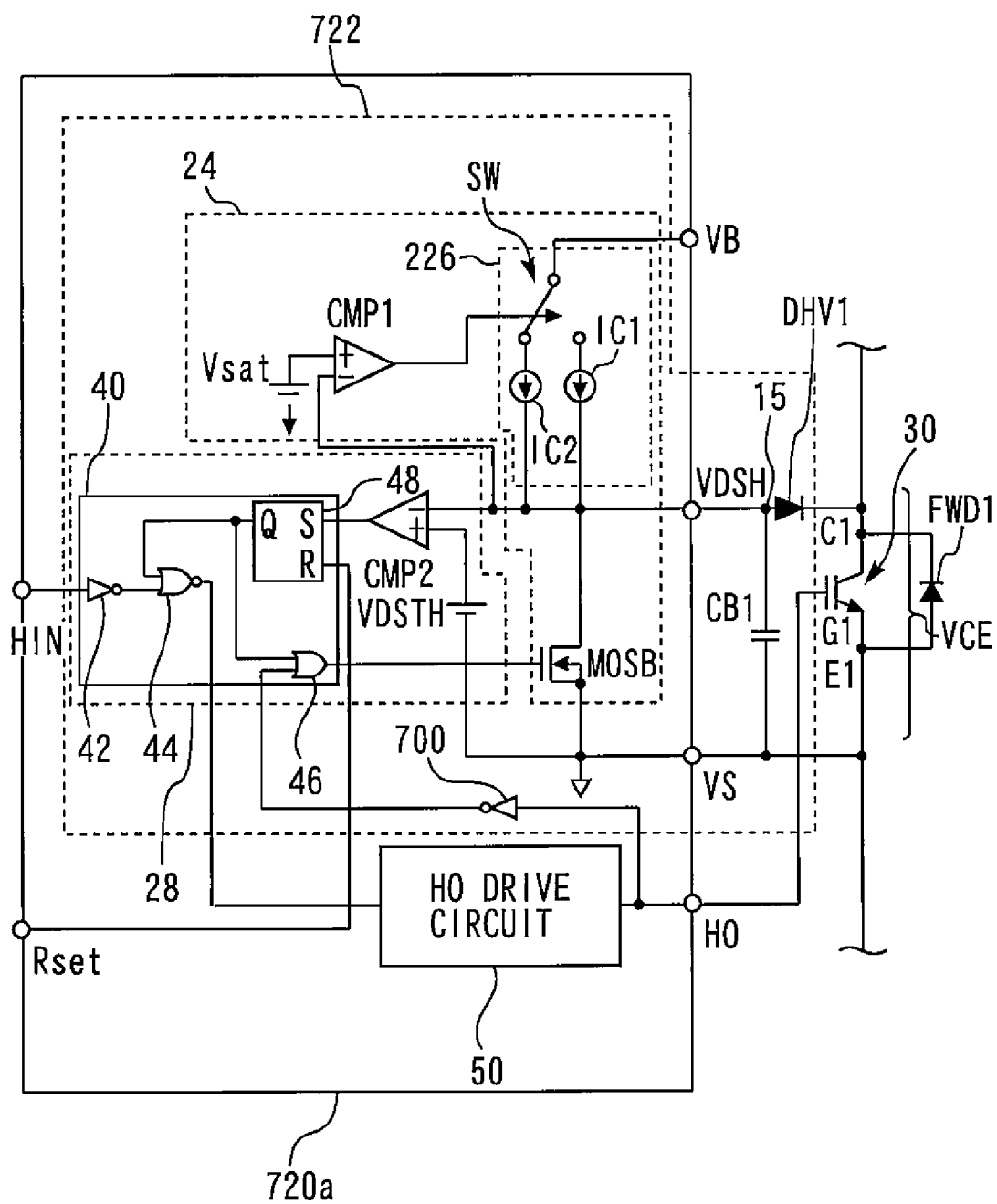
FIG. 18 is a circuit diagram showing the configuration of a driving device for semiconductor elements according to Embodiment 7 of the present invention and components on the periphery of the driving device for semiconductor elements.

FIG. 18 is a circuit diagram showing the configuration of a driving device for semiconductor elements according to Embodiment 7 of the present invention and components on the periphery of the driving device for semiconductor elements. The driving device for semiconductor elements according to Embodiment 7 is HVIC 720a. The HVIC 720a and the external circuit form a desat detection circuit section 722.

The circuit arrangement connected to the gate of the transistor MOSB in the HVIC 720a according to Embodiment 7 differs from that in Embodiment 1. In the HVIC 720a according to Embodiment 7, an output from a NOT circuit 700 is input to the OR circuit 46. The output from the HO drive circuit section 50 is input to the NOT circuit 700. In this arrangement, a signal synchronized with the rise of the signal output from the HO drive circuit section 50 is input to the gate of the transistor MOSB through the NOT circuit 700 and the OR circuit 46. As a result, the transistor MOSB can be turned on and off according to the signal synchronized with the signal appearing at the terminal HO (i.e., the output signal from the HO drive circuit section 50).

This differs from turning the transistor MOSB on and off according to the input signal to the terminal HIN in Embodiment 1. In the HVIC 20a according to Embodiment 1, the output signal from the OR circuit 46 is input to the gate of the transistor MOSB in the charging circuit section 24.

It is assumed that, except for the above-descried points of difference, a semiconductor device according to Embodiment 7 has the same configuration as that of the semiconductor device (inverter device 10) according to Embodiment 1, and that, with the same exceptions, the HVIC 720a, i.e., the driving device for semiconductor elements according to Embodiment 7, has the same configuration as that of the HVIC 20a, i.e., the driving device for semiconductor elements according to Embodiment 1.

Figure 19:
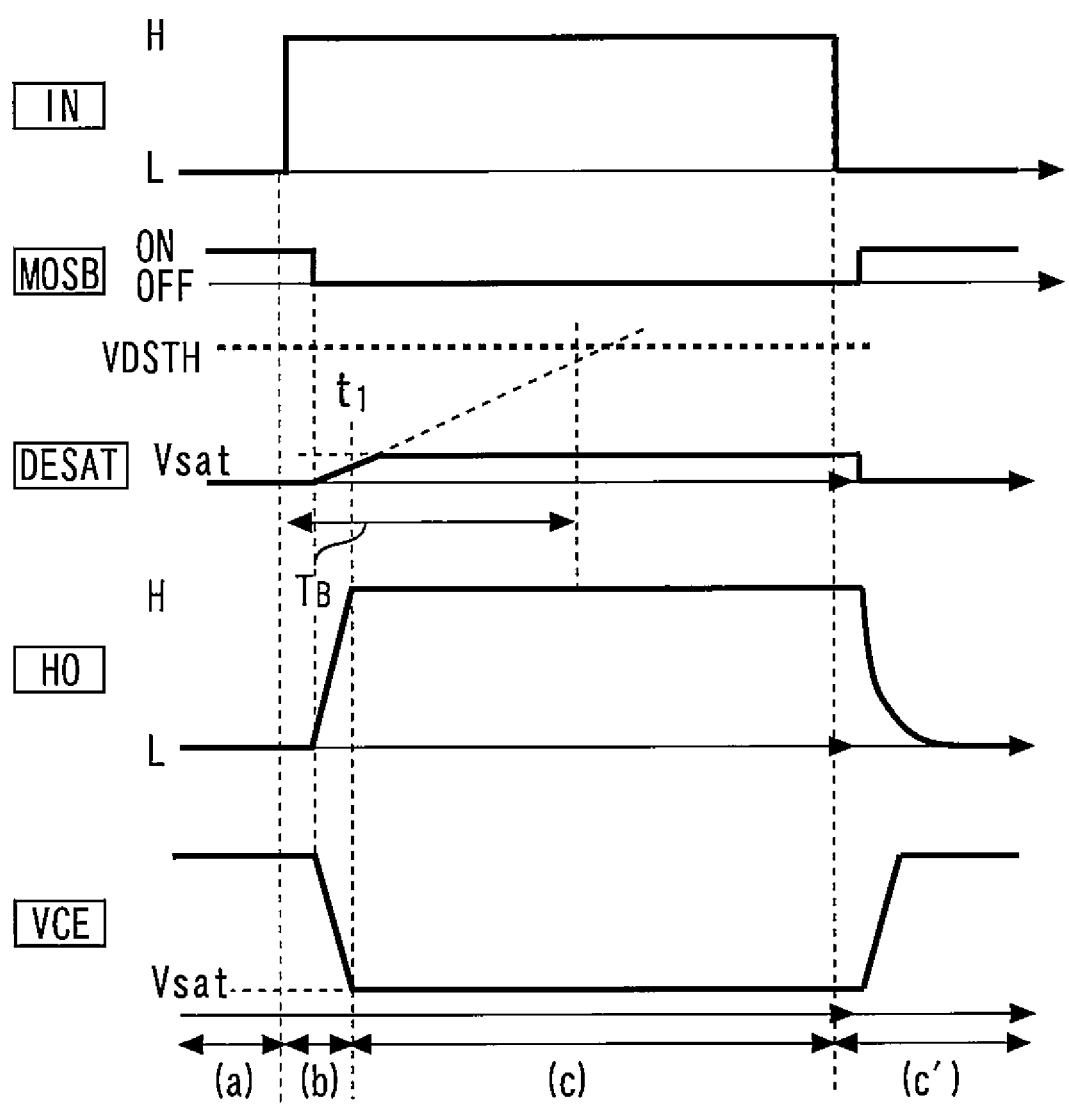
FIG. 19 is a time chart showing the operation in an ordinary situation in the driving device for semiconductor elements according to Embodiment 7 of the present invention.

FIG. 19 is a time chart showing the operation in an ordinary situation in the driving device for semiconductor elements according to Embodiment 7 of the present invention. In the driving device for semiconductor elements according to Embodiment 7, the transistor MOSB is turned off at a timed point different from that in the case of the driving device for semiconductor elements according to Embodiment 1.

In the circuit arrangement according to Embodiment 1, change between the on- and off-states of the transistor MOSB is made in synchronization with the input signal to the terminal HIN. On the other hand, in the circuit arrangement according to Embodiment 7, change between the on- and off-states of the transistor MOSB is made in synchronization with the output signal at the terminal HO. In Embodiment 7, therefore, change between the on- and off-states of the transistor MOSB is delayed relative to that in Embodiment 1. With this delay, the timed point at which charging of the blanking capacitive element CB1 is started and the rise of the voltage on the desat terminal VDSH are also delayed relatively.

Figure 20:
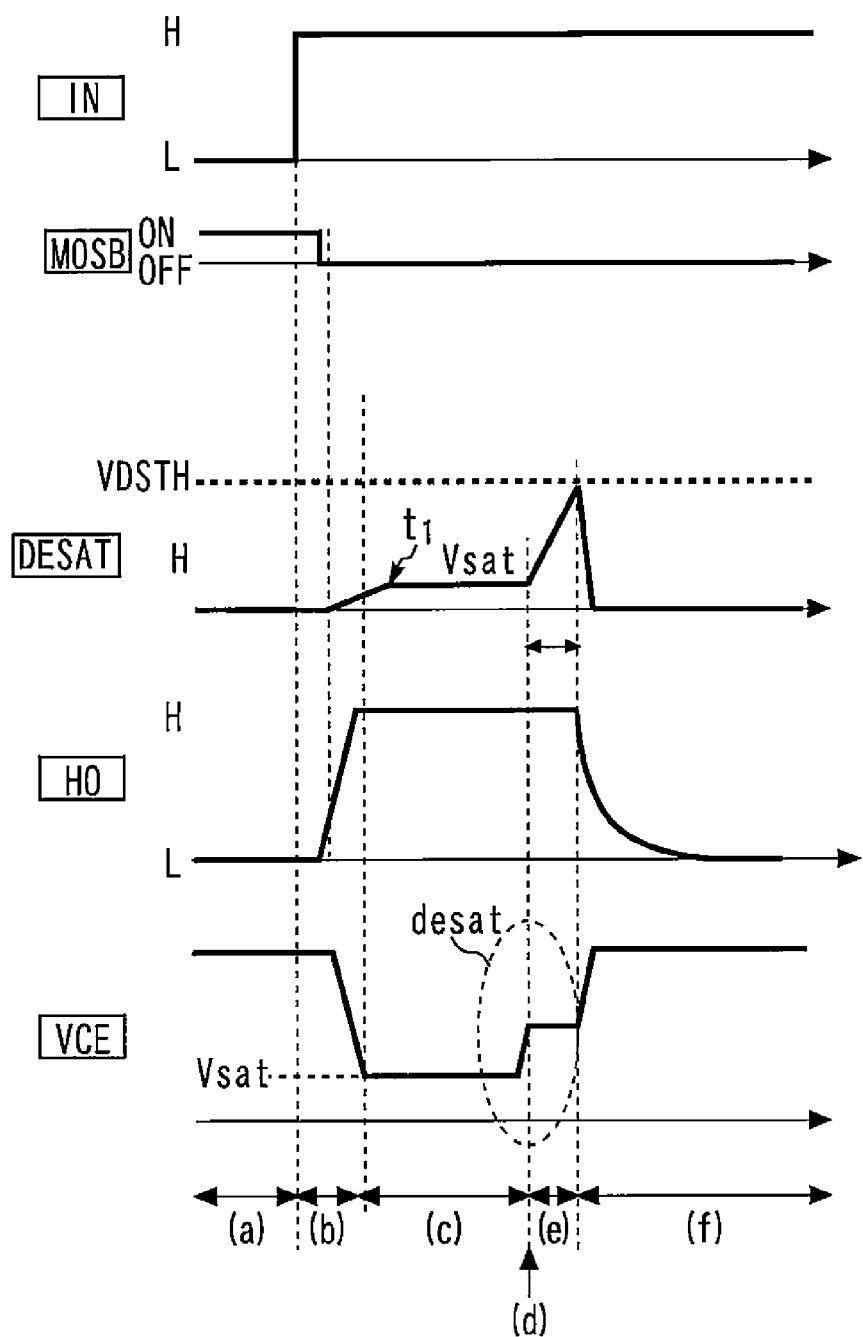
FIG. 20 is a time chart showing the operation at the occurrence of a short circuit (in the event of a short circuit when the IGBT is on) in the driving device for semiconductor elements according to Embodiment 7 of the present invention.

In other respects, the configuration and operation are the same as those in the driving device for semiconductor elements according to Embodiment 1. FIG. 20 is a time chart showing the operation at the occurrence of a short circuit (in the event of a short circuit when the IGBT is on) in the driving device for semiconductor elements according to Embodiment 7 of the present invention. That is, also in the arrangement according to Embodiment 7, high-speed charging can be realized by changing the current source for supply of current to the connection point 15 to the rapid charging constant current source IC2 at timed point t1.

In Embodiment 7, the circuit arrangement (FIG. 3) according to Embodiment 1 is presupposed. The present invention, however, is not limited to this. Each of the arrangements according to Embodiments 2 to 6 is applicable to Embodiment 7. That is, modifications described below are possible in the HVIC 720a shown in FIG. 18. The constant current supply section 26 may be replaced with the constant current supply section 226, as in Embodiment 2. The comparator CMP1 may be replaced with the hysteresis comparator CMPH, as in Embodiment 3. The stop circuit section 425 may be provided between the hysteretic comparator CMPH and the transistor MOS2, as in Embodiment 4. The latch circuit section 525 may be provided between the comparator CMP1 and the transistor MOS2, as in Embodiment 5. The input voltage to the positive terminal of the hysteretic comparator CMPH (reference voltage) may be changed to Vsat', as in Embodiment 6.

REFERENCE SIGNS LIST 10 inverter device, 12 smoothing capacitor, 14a drive circuit, 14b drive circuit, 15 connection point, 16 bootstrap circuit, 20a HVIC, 22 desat detection circuit section, 24 charging circuit section, 26 constant current supply section, 28 shutting circuit section, 30, 31, 32, 33, 34, 35 IGBT, 40 desat protection circuit section, 50 drive circuit section, CB1, CB2 blanking capacitive element, CBTS bootstrap capacitor, CMP1, CMP2 comparator, CMPH hysteretic comparator, DBTS bootstrap diode, DHV1, DHV2 high-withstand-voltage diode, MOS2, MOSB transistor, SW switch section, VDSH, VDSL desat terminal

The invention claimed is:

1. A device for driving a semiconductor element comprising:
   a drive circuitry configured to be electrically connected to a semiconductor element including a first electrode, a second electrode and a control terminal with which switching between conduction and shut between the first and second electrodes is performed, the drive circuitry driving the semiconductor element by receiving an input signal, producing a drive signal from the input signal and supplying the drive signal to the control terminal;
   a charging circuitry configured to be electrically connected to an external circuitry including a diode having its cathode connected to the first electrode and a capacitive element having one of its two terminals connected to the anode of the diode and having the other of its terminals connected to the second electrode, the charging circuitry charging the capacitive element on the basis of one of the input signal and the drive signal, the charging circuitry detecting a charging voltage at which the capacitive element is charged, supplying a constant current of a first value to a point of connection between the anode and the one of the two terminals when the charging voltage is lower than a saturation voltage of the semiconductor element in a case where the one of the signals is an on-signal, and supplying to the connection point a constant current of a second value larger than the first value after a timed point at which the charging voltage becomes equal to the saturation voltage of the semiconductor element; and a shutting circuitry which shuts off the supply of the drive signal to the control terminal from the drive circuitry when the charging voltage reaches a threshold value.

2. The device according to claim 1, wherein the charging circuitry includes:
   a comparator which issues an output signal when the charging voltage reaches a reference voltage;
   a constant current supply circuitry which produces each of the first-value constant current and the second-value constant current, and changes the current supplied to the connection point so that the current supplied to the connection point is the first-value constant current when the comparator does not issue the output signal, and the current supplied to the connection point is the second-value constant current when the comparator issues the output signal; and
   a first transistor which receives by a control terminal a signal synchronized with one of the input signal and the drive signal, which is connected in parallel with the capacitive element, which makes conduction between the one and the other of the terminals of the capacitive element when the one of the signals is an off-signal, and which shuts off conduction between the one and the other of the terminals of the capacitive element when the one of the signals is an on-signal.

3. The device according to claim 2, wherein the constant current supply circuitry includes:
   a first constant current source which produces the first-value constant current;
   a second constant current source which produces the second-value constant current; and
   a switch circuitry which selectively connects one of the first constant current source and the second constant current source to the capacitive element on the basis of the output from the comparator.

4. The device according to claim 2, wherein the constant current supply circuitry includes:
   an ordinarily operational constant current source which produces the first-value constant current; and
   a second transistor connected in parallel with the ordinarily operational constant current source, the second transistor being turned on to additionally supply a current to the capacitive element and to thereby produce the second-value constant current, and
   wherein the output signal from the comparator is input to a control terminal of the second transistor, and the second transistor is turned on by the output signal from the comparator.

5. The device according to claim 2, wherein the comparator is a hysteresis comparator.

6. The device according to claim 5, wherein the shutting circuitry includes:
   a comparator which receives the charging voltage by a first terminal and issues a detection signal when the voltage on the first terminal reaches a voltage on a second terminal; and
   a desat protection circuitry which shuts off input of the input signal to the drive circuitry by receiving the detection signal, and
   wherein the charging circuitry includes a stop circuitry which stops increase in the current to the capacitive element regardless of the output signal from the hysteretic comparator when the detection signal is issued.

7. The device according to claim 3, further comprising a latch circuitry provided between the comparator and the constant current supply circuitry,
   wherein the latch circuitry causes the constant current supply circuitry to maintain the state of supplying the second-value constant current when receiving the output signal from the comparator.

8. The device according to claim 2, wherein the reference voltage is lower than the saturation voltage.

9. A semiconductor device comprising:
   a semiconductor element including a first electrode, a second electrode and a control terminal with which switching between conduction and shut between the first and second electrodes is performed;
   a drive circuitry electrically connected to the semiconductor element, the drive circuitry driving the semiconductor element by receiving an input signal, producing a drive signal from the input signal and supplying the drive signal to the control terminal;
   an external circuitry including a diode having its cathode connected to the first electrode and a capacitive element having one of its two terminals connected to the anode of the diode and having the other of its terminals connected to the second electrode;
   a charging circuitry electrically connected to the external circuitry, the charging circuitry charging the capacitive element on the basis of one of the input signal and the drive signal, the charging circuitry detecting a charging voltage at which the capacitive element is charged, supplying a constant current of a first value to a point of connection between the anode and the one of the two terminals when the charging voltage is lower than a saturation voltage of the semiconductor element in a case where the one of the signals is an on-signal, and supplying to the connection point a constant current of a second value larger than the first value after a timed point at which the charging voltage becomes equal to the saturation voltage of the semiconductor element; and
   a shutting circuitry which shuts off the supply of the drive signal to the control terminal from the drive circuitry when the charging voltage reaches a threshold value.

10. The semiconductor device according to claim 9, wherein the charging circuitry includes:
    a comparator which issues an output signal when the charging voltage reaches a reference voltage;
    a constant current supply circuitry which produces each of the first-value constant current and the second-value constant current, and changes the current supplied to the connection point so that the current supplied to the connection point is the first-value constant current when the comparator does not issue the output signal, and the current supplied to the connection point is the second-value constant current when the comparator issues the output signal; and a first transistor which receives by a control terminal a signal synchronized with one of the input signal and the drive signal, which is connected in parallel with the capacitive element, which makes conduction between the one and the other of the terminals of the capacitive element when the one of the signals is an off-signal, and which shuts off conduction between the one and the other of the terminals of the capacitive element when the one of the signals is an on-signal.

11. The semiconductor device according to claim 10, wherein the constant current supply circuitry includes:

a first constant current source which produces the first-value constant current;

a second constant current source which produces the second-value constant current; and a switches circuitry which alternatively connects one of the first constant current source and the second constant current source to the capacitive element on the basis of the output from the comparator.

12. The semiconductor device according to claim 10, wherein the constant current supply circuitry includes:

an ordinarily operational constant current source which produces the first-value constant current; and a second transistor connected in parallel with the ordinarily operational constant current source, the second transistor being turned on to additionally supply a current to the capacitive element and to thereby produce the second-value constant current, and wherein the output signal from the comparator is input to a control terminal of the second transistor, and the second transistor is turned on by the output signal from the comparator.

13. The semiconductor device according to claim 10, wherein the comparator is a hysteresis comparator.

14. The semiconductor device according to claim 13, wherein the shutting circuitry includes:

a comparator which receives the charging voltage by a first terminal and issues a detection signal when the voltage on the first terminal reaches a voltage on a second terminal; and a desat protection circuitry which shuts off input of the input signal to the drive circuit by receiving the detection signal, and wherein the charging circuitry includes a stop circuitry which stops increase in the current to the capacitive element regardless of the output signal from the hysteretic comparator when the detection signal is issued.

15. The semiconductor device according to claim 11, further comprising a latch circuitry inserted between the comparator and the constant current supply circuitry, wherein the latch circuitry causes the constant current supply circuitry to maintain the state of supplying the second-value constant current when receiving the output signal from the comparator.

16. The semiconductor device according to claim 10, wherein the reference voltage is lower than the saturation voltage.

* * * * *